United States Patent [19]

Mesch et al.

[11] Patent Number: 4,602,417
[45] Date of Patent: Jul. 29, 1986

[54] INTERCONNECTOR ATTACHMENT MACHINE

[75] Inventors: Hans G. Mesch, Manhattan Beach; Albert F. Wollner, Torrance; Charles E. Gibson, Lomita; Kenneth Lui, Fountain Valley, all of Calif.

[73] Assignee: TRW Inc., Redondo Beach, Calif.

[21] Appl. No.: 545,016

[22] Filed: Oct. 24, 1983

[51] Int. Cl.⁴ .............................................. B23P 23/00
[52] U.S. Cl. .................................... 29/564; 29/33 K; 29/33 P; 29/563; 29/712; 29/719; 29/720; 29/743; 29/792; 29/810; 228/6.2; 228/47; 269/21; 279/3
[58] Field of Search .............. 29/564, 563, 33 J, 33 K, 29/33 P, 564.1, 564.6, 712, 719, 720, 743, 791, 760, 792, 822, 823, 824; 228/6.1, 6.2, 7, 10, 11, 35, 47; 279/3; 269/21

[56] References Cited

U.S. PATENT DOCUMENTS

| | | | |
|---|---|---|---|
| 1,635,536 | 7/1927 | Butler | 29/33 J |
| 1,884,683 | 10/1932 | Hermani | 228/6.1 |
| 2,028,225 | 1/1936 | Larson | 29/33 J |
| 3,699,640 | 10/1972 | Cranston et al. | 29/471.1 |
| 3,930,809 | 1/1976 | Evans | 29/720 |
| 3,961,413 | 6/1976 | Noe | 228/6.2 |
| 4,151,945 | 5/1979 | Ragard et al. | 228/7 |
| 4,267,003 | 5/1981 | Mesch et al. | 156/356 |
| 4,457,662 | 7/1984 | Ireland et al. | 29/743 |

OTHER PUBLICATIONS

Study of Automated Module Fabrication for Lightweight Solar Blanket Utilization Final Report TRW 79.5536.3-06 dated May 1979.

Primary Examiner—Gil Weidenfeld
Assistant Examiner—Daniel W. Howell
Attorney, Agent, or Firm—Stuart O. Lowry; Donald R. Nyhagen

[57] ABSTRACT

An integrated and automated multistation machine is provided for placement and attachment of electrically conductive interconnectors onto solar cells and the like. The machine comprises a rotatable turntable for supporting a plurality of solar cells in respective association with a corresponding plurality of operating stations and then for indexing the solar cells to the next operating stations in sequence. More particularly, the machine includes a cell loading station for transfer of a solar cell from a loading magazine and for precision placement onto one of a plurality of cell-supporting fixtures carried by the turntable. The turntable indexes the solar cells one at a time on the fixtures from the cell loading station first to a flux station whereat a liquid flux material is applied to predetermined points on the cell. The flux-bearing cell is then indexed in sequence to an interconnector dispensing station which places an interconnector at a predetermined point on the solar cell and then to an attachment station which secures the interconnector to the cell as by soldering. Additional pairs of interconnector dispensing and attachment stations may be provided for placing and attaching additional interconnectors onto the cell. The resultant cell/interconnector subassembly is then indexed to an inspection station and finally to a cell unloading station whereat the subassembly is transferred from the cell-supporting fixture and placed into an unloading magazine for removal from the machine.

16 Claims, 27 Drawing Figures

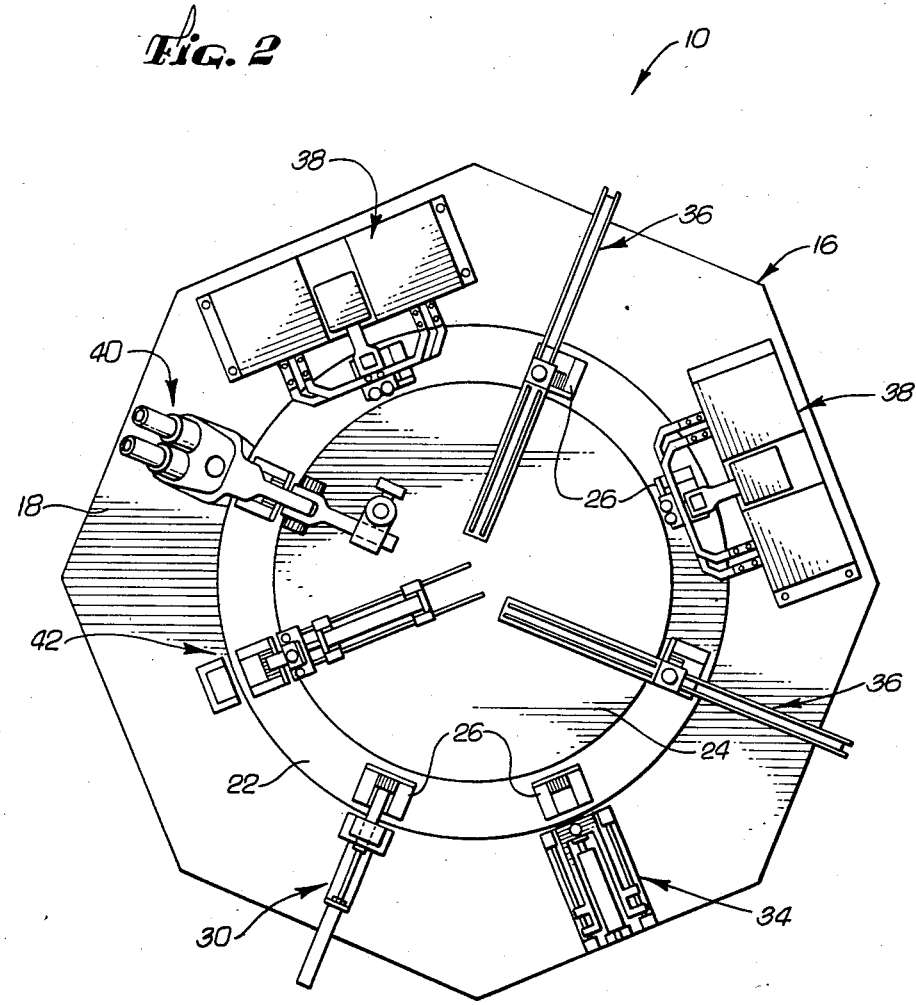

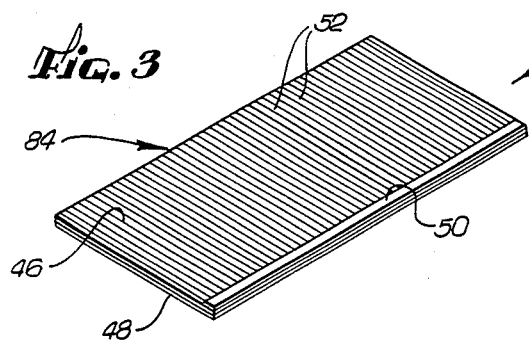
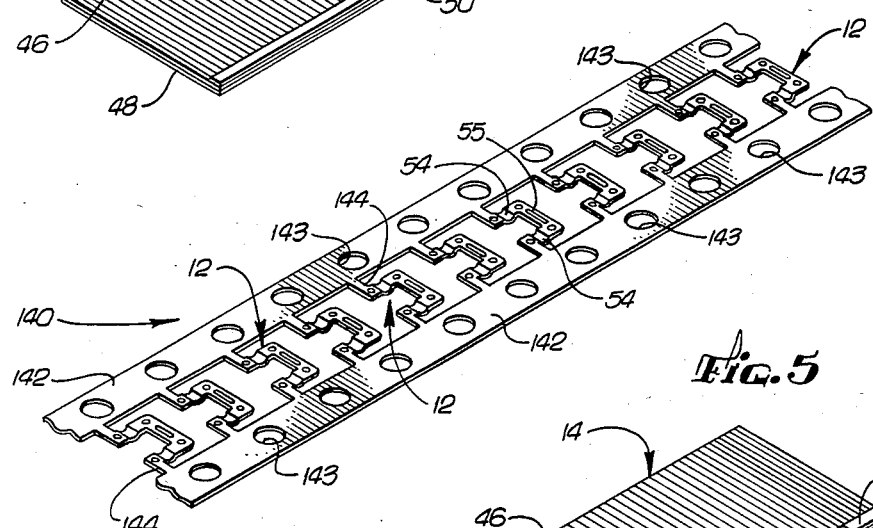
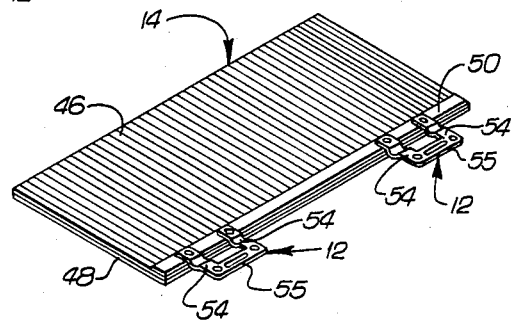
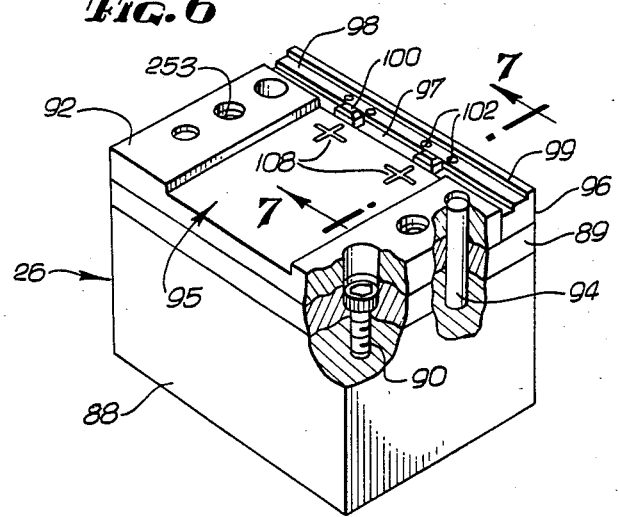
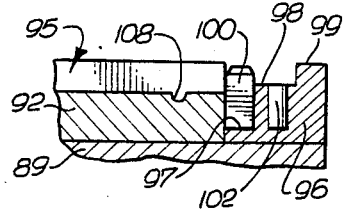

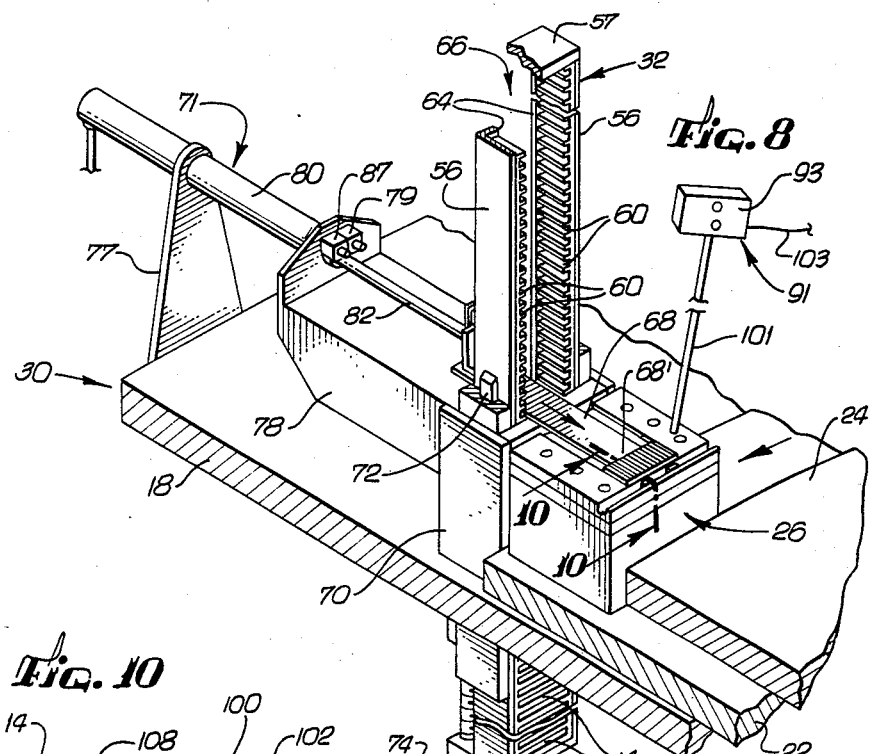
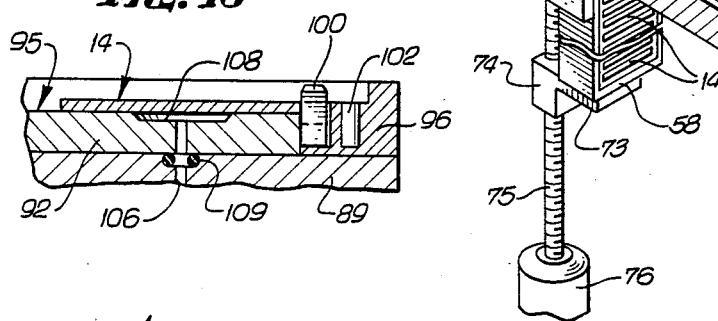
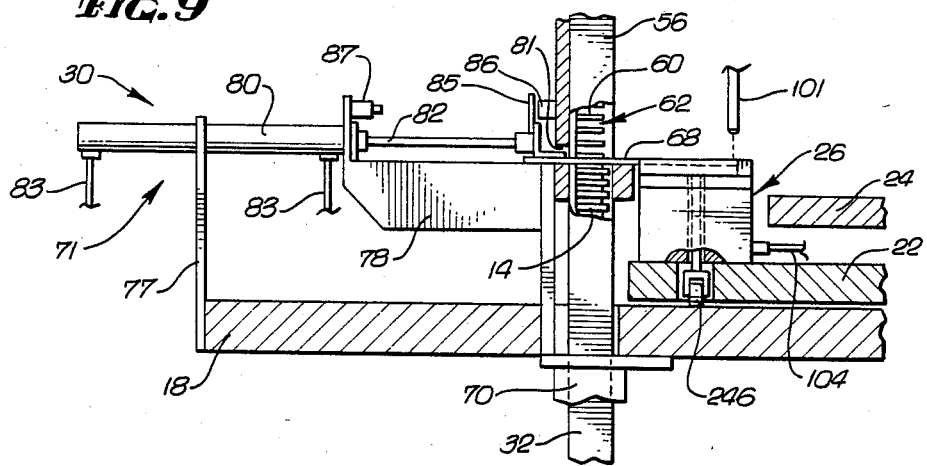

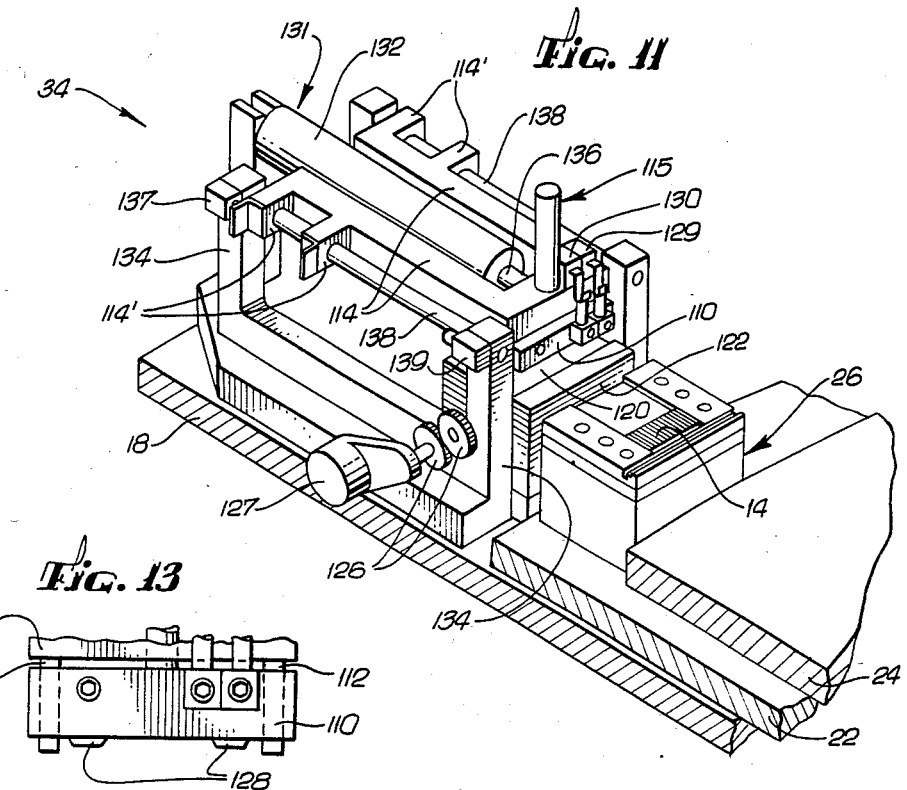
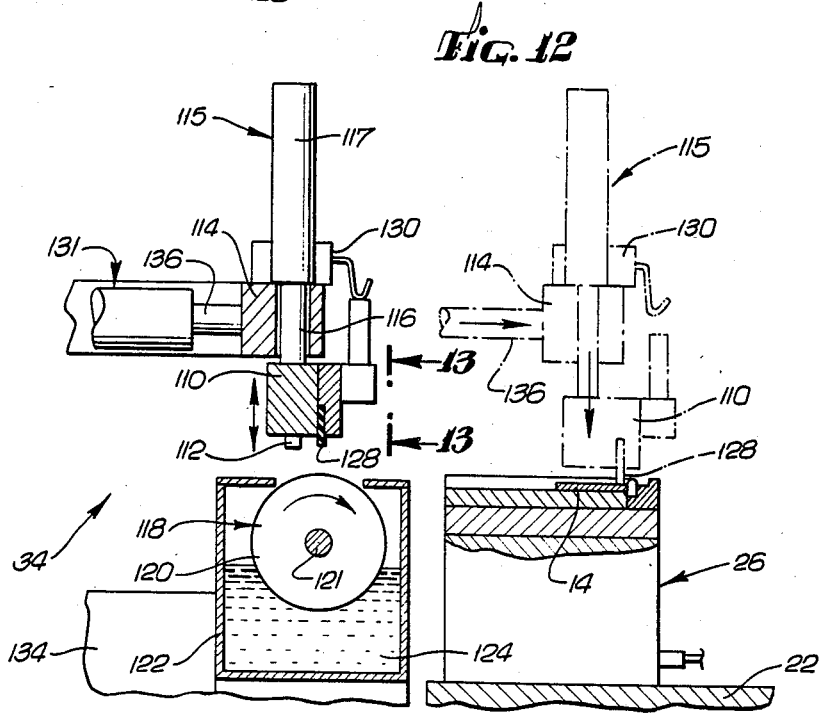

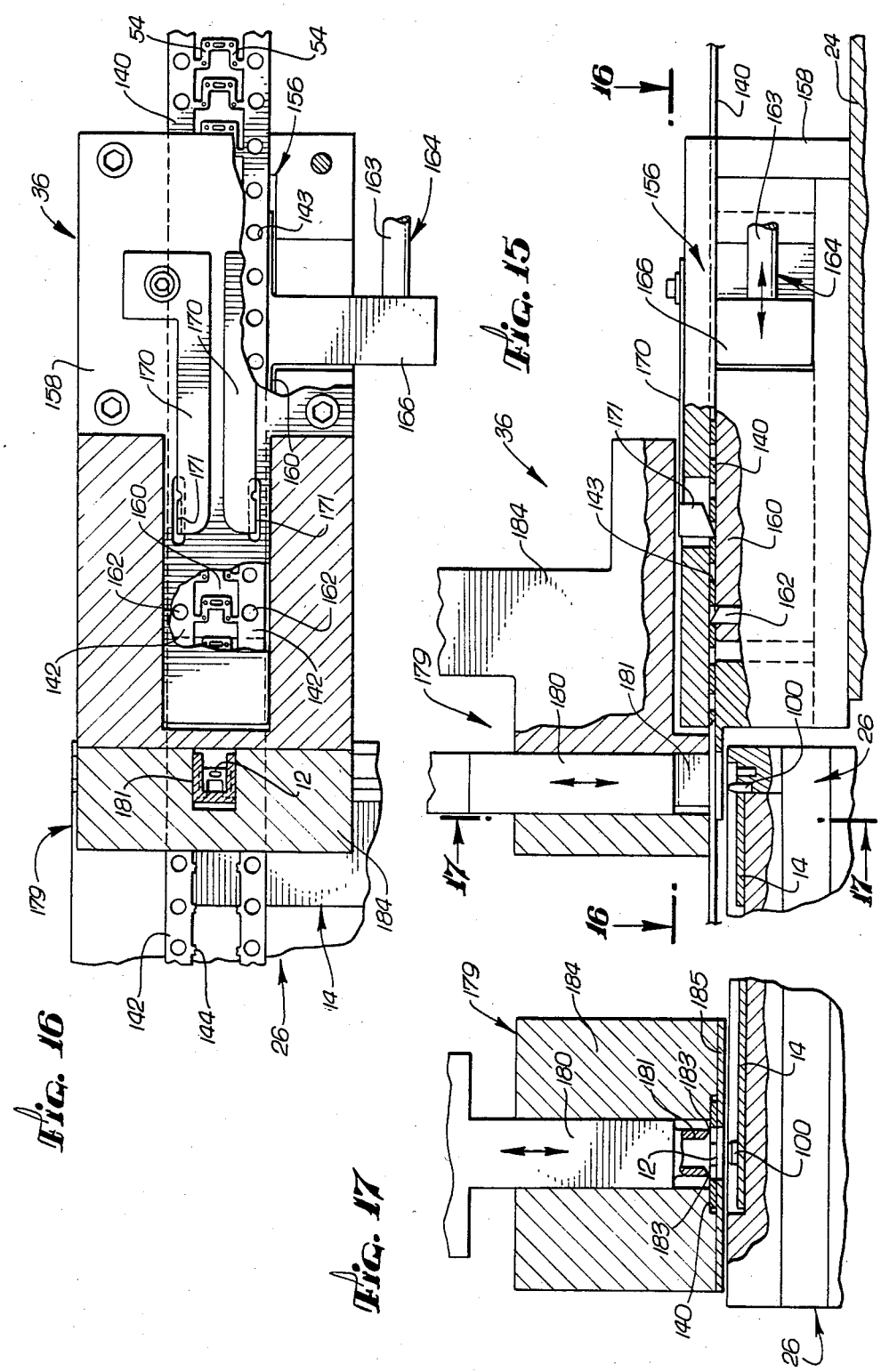

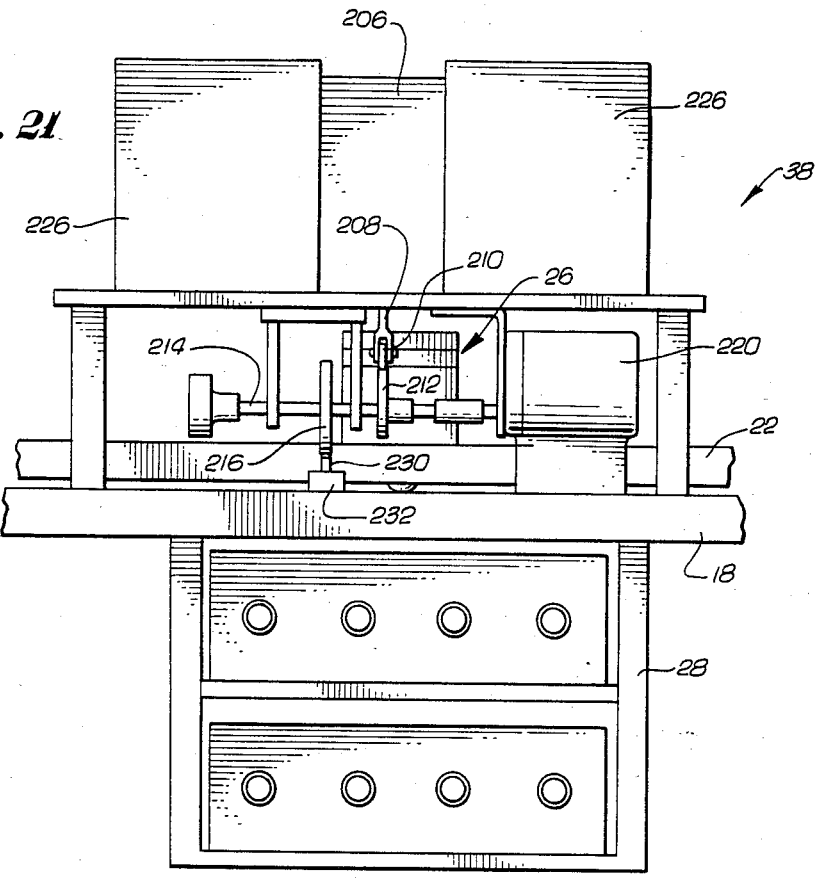
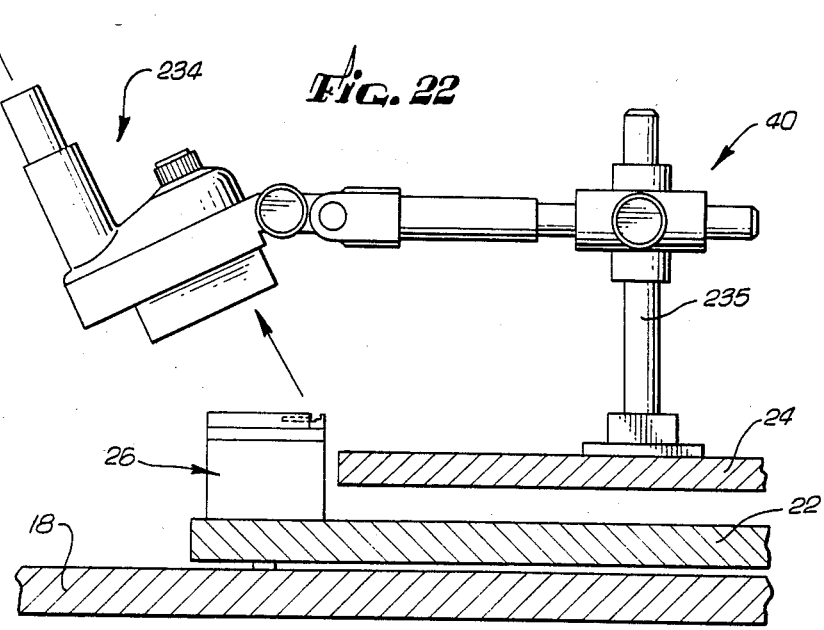

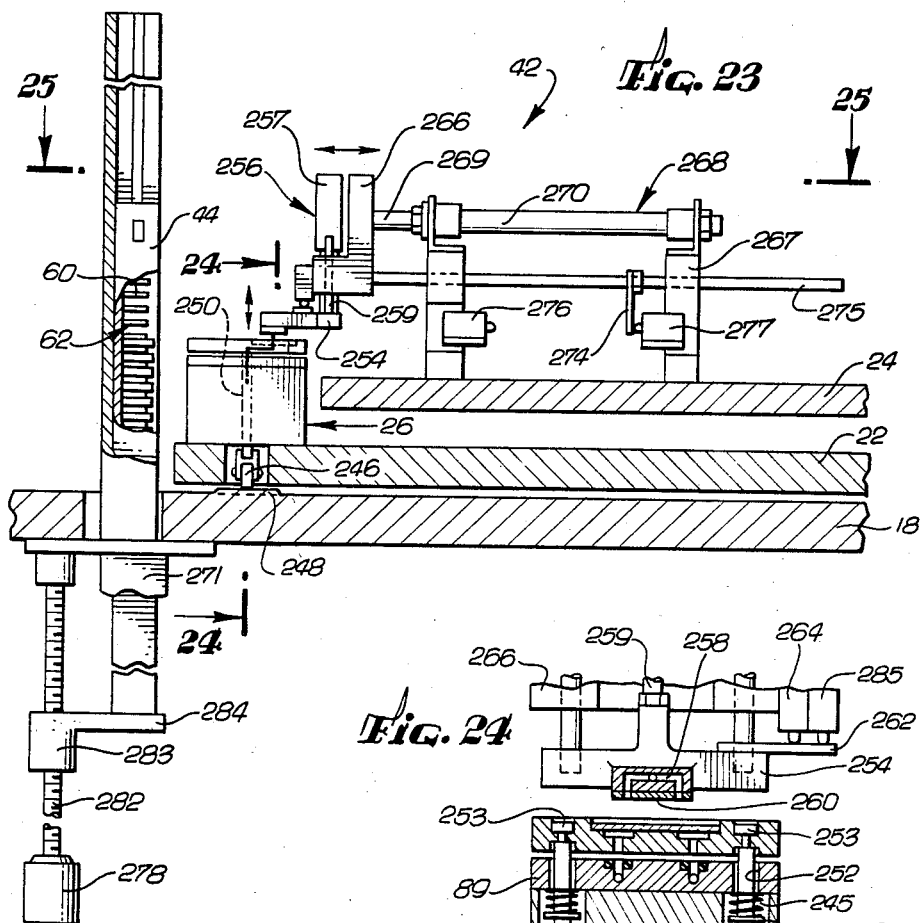
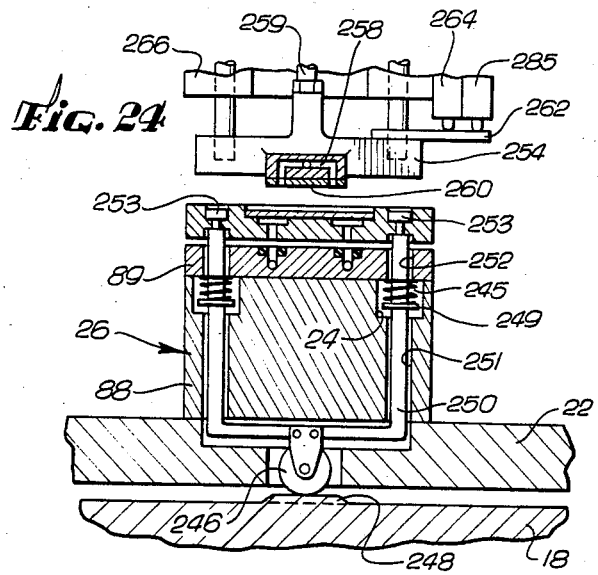
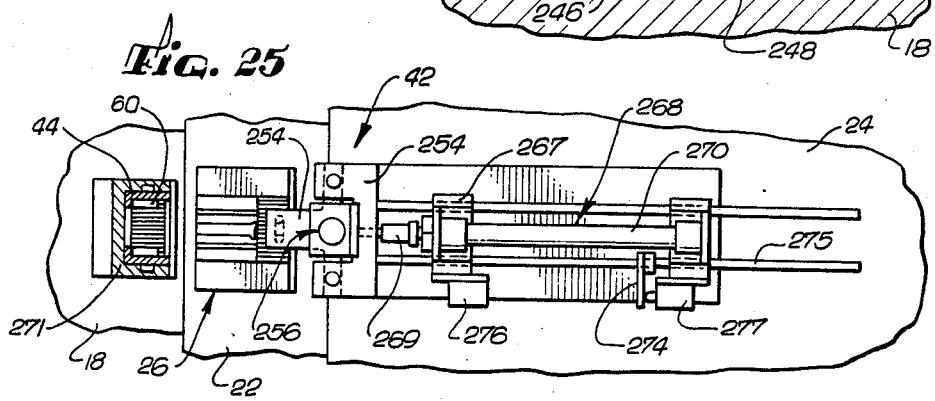

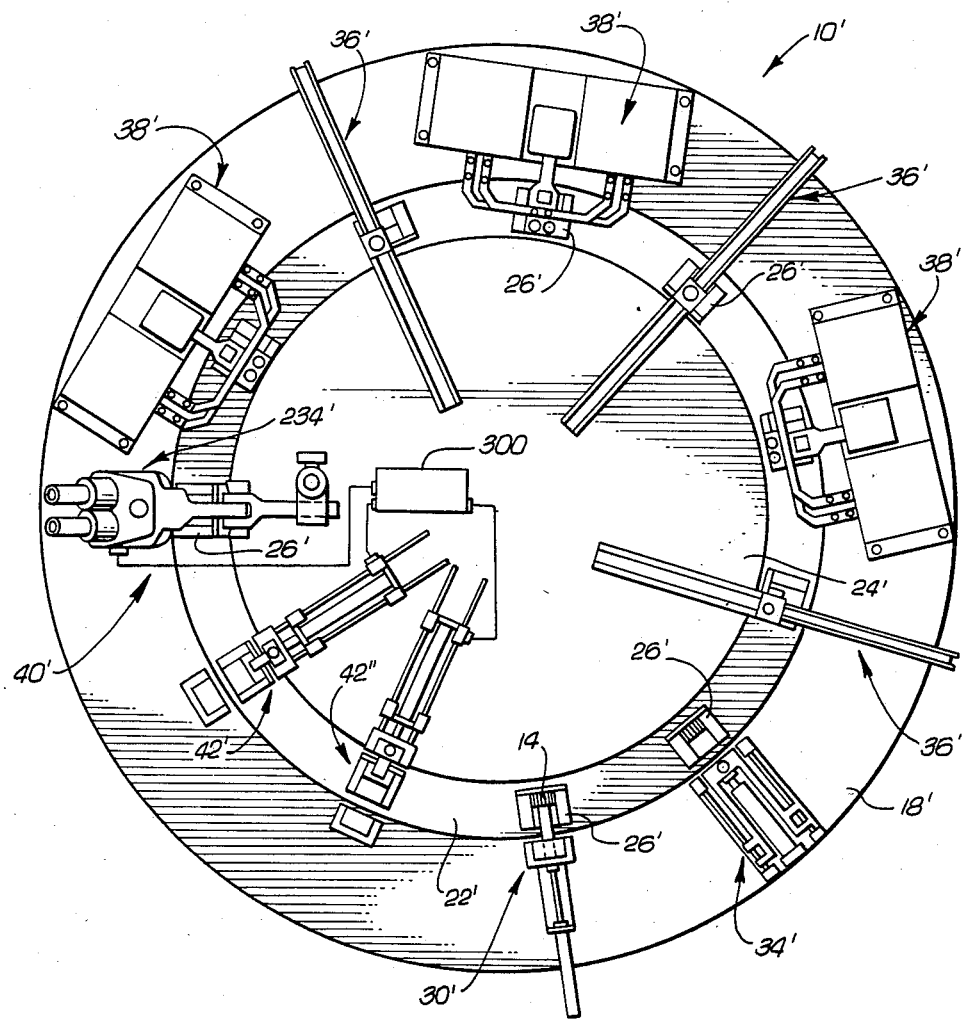

INTERCONNECTOR ATTACHMENT MACHINE

BACKGROUND OF THE INVENTION

This invention relates generally to apparatus for use in the manufacture of solar cell arrays for converting solar radiation to electrical energy. More particularly, this invention relates to an automated, multistation machine for precision placement and attachment of electrically conductive interconnectors onto individual solar cells at a relatively high production rate.

Solar cells are relatively well known for use in converting incident solar radiation into electrical energy. A typical solar cell comprises a relatively thin sheet of doped silicon semiconductor material supported upon a thin metallic backing, with a thin and narrow conductive contact strip extending along the top surface of the semiconductor sheet at one marginal edge thereof. The substantial majority of the top surface of the semiconductor sheet is thereby exposed to incident solar radiation and constitutes an active or light-sensitive surface which responds to the incident radiation to produce a relatively small electrical current and voltage. A large number of these individual solar cells are commonly mounted side by side onto a generally planar substrate of extended surface area and are appropriately connected electrically in series and in parallel to form a solar cell array having selected electrical power generating characteristics. Solar cell arrays of this general type have constituted an important source of electrical power in a wide variety of environments, including, for example, the provision of electrical power in long term satellites.

Individual solar cells within a solar cell array have thus required an electrically conductive component, commonly referred to as an interconnector, for electrically coupling the solar cell with adjacent solar cells in the array. Such interconnectors commonly comprise a relatively thin and lightweight metallic ribbon chosen for thermal compatibility and high quality connection as by soldering with the metallic backing and/or the conductive contact strip on a solar cell, thereby minimizing risk of solar cell breakage during use which would result in an electrical open circuit within the solar cell array. Moreover, several interconnectors are frequently used with each solar cell to provide multiple or redundant electrical connections which further decrease and substantially eliminate risk of electrical open circuits. Such redundant connections within a solar cell array are particularly desirable in an outer space environment, since access to the array for repair purposes is impractical or impossible.

In the manufacture of solar cells for use in a solar cell array, a plurality of interconnectors is commonly attached by soldering or welding onto the conductive contact strips of individual solar cells as an intermediate steps in the manufacturing process. Such interconnector installation requires relatively high precision to insure correct interconnector placement and attachment onto a solar cell within relatively close tolerance limits. Moreover, such installation must be performed without damaging the solar cell which is typically extremely fragile, with solar cells of the type used in outer space environments having extremely thin thicknesses on the order of 200 microns. In the past, however, interconnector placement and attachment has required a significant degree of manual labor including manual handling of both the solar cell and the interconnectors. Such manual procedures have proven undesirably tedious and time consuming resulting in relatively slow production rates and correspondingly undesirable high costs of manufacture. Moreover, notwithstanding exercise of great care during manual cell handling, unacceptably high levels of cell breakage and reject cell/interconnector connections have been unavoidable.

There exists, therefore, a significant need for a practical automated machine for rapidly and safely placing interconnectors with precision onto individual solar cells and then for attaching the interconnectors to the solar cells. The present invention fulfills this need and provides further related advantages.

SUMMARY OF THE INVENTION

In accordance with the invention, an integrated and automated multistation machine is provided for precision placement and attachment of electrically conductive interconnectors onto individual solar cells without requiring manual cell handling. The machine comprises a rotatable turntable carrying at its periphery a plurality of cell-supporting fixtures which support a corresponding plurality of individual solar cells of selected size in respective association with a plurality of machine operating stations. The operating stations are controlled by a central control unit to perform substantially simultaneously respective prescribed steps in a sequence of interconnector placement and attachment steps with respect to the solar cell supported thereat, after which the turntable is indexed by the central control unit to transfer the plurality of solar cells to the next respective operating stations in sequence.

In a preferred form of the invention, the machine includes a cell loading station supported on a machine frame and including a reciprocal loading plate for tranferring a solar cell from a loading magazine onto one of the turntable fixtures each time the turntable is indexed. The turntable fixture has a removable upper support plate defining a channel of selected size into which the solar cell of corresponding size is placed by action of the loading plate. One or more guide posts on the fixture cooperate with vacuum means for positioning and retaining the loaded solar cell in a precise predetermined position. Detector means can be provided for sensing correct solar cell placement on the fixture and for interrupting machine operation in the event of improper cell placement.

The loaded solar cell on the turntable fixture is indexed by the turntable to a flux station at which a flux applicator head picks up a small quantity of a liquid flux material from a wetted surface of a rotating drum partially submerged into a flux material bath. The flux applicator head then advances to a position over the solar cell and descends to wet predetermined points on the solar cell with the flux material, wherein these predetermined points are typically located on a conductive contact strip extending along one marginal edge of the top surface of the solar cell whereat interconnector attachment is desired.

The flux-bearing solar cell is then indexed by the turntable to an interconnector dispensing station. The dispensing station has a ratchet drive assembly which draws with controlled tension an elongated ribbon of conductive material from a supply reel, wherein this ribbon has a plurality of individual interconnectors formed along its length. The ratchet drive assembly advances the ribbon in a precision manner to position the next interconnector between an overlying punch head and the underlying solar cell. The punch head descends to separate the interconnector from the ribbon and simultaneously to place the interconnector on the solar cell in a predetermined position with the fixture guide post functioning to enhance accurate interconnector placement. Relatively small magnets on the fixture are also provided to securely retain the interconnector in place.

With the interconnector supported in the desired position on top of the solar cell, the cell is then indexed to an attachment station having one or more soldering or welding heads for descending into contact with the interconnector and for securing the interconnector onto the solar cell. Additional interconnectors can also be installed by subsequent sequential pairs of interconnector dispensing and attachment stations located about the turntable, with the flux applicator head at the flux station appropriately wetting the solar cell with flux material at each point to which an interconnector is to be attached.

Subsequent to the last attachment station, the resultant cell/interconnector subassembly is transferred on the turntable to an inspection station for visual or programmed inspection to check for acceptable interconnector placement and attachment. Faulty subassemblies can be removed for appropriate discard or rework, whereas acceptable subassemblies are indexed to an unloading station. At the unloading station, the retaining action of the fixture vacuum means is interrupted to permit facilitated lifting of the cell/interconnector subassembly from the fixture by a vacuum pick-up head which transfers the subassembly to an unloading magazine and then interrupts the pick-up vacuum as by connection to a slight pressure source to separate the subassembly from the pick-up head.

When the inspection station is programmed for automatic inspection of the cell/interconnector subassemblies, the programmed inspection station can be adapted to control unloading of the cell/interconnector subassemblies into one of two separate unloading stations. More particularly, the inspection station can be programmed to instruct the machine to transfer reject cell/interconnector subassemblies to a first unloading station and to transfer acceptable subassemblies to a second unloading station thereby providing automated separation of reject and acceptable subassemblies without requiring manual intervention.

The operation of the machine operating stations and the turntable is advantageously correlated and controlled by the central control unit. More particularly, in the preferred form, the control unit includes a plurality of state switches at various operating stations for respective closure when the mechnical components at those stations complete their procedures on the associated cell and return to their initial positions located out of the way with respect to turntable rotation. These state switches are series-connected in a turntable actuation circuit to collectively control turntable motion such that the turntable is actuated for rotation only when all of the state switches are closed, which occurs only when all of the station components are in their safe, out-of-the-way postions.

Other features of the present invention will become more apparent from the following detailed description, taken in conjunction with the accompanying drawings, which illustrate, by way of example, the principles of the invention.

BRIEF DESCRIPTION OF THE DRAWINGS

The accompanying drawings illustrate the invention. In such drawings:

FIG. 2 is a top plan view of the interconnector attachment machine;

FIG. 3 is a perspective view of an exemplary solar cell prior to attachment thereto of one or more electrically conductive interconnectors;

FIG. 4 is a fragmented perspective view illustrating a ribbon of conductive material having a progression of interconnectors formed along its length;

FIG. 5 is a perspective view illustrating a solar cell/interconnector subassembly;

FIG. 6 is an enlarged perspective view illustrating a cell-supporting fixture for supporting a solar cell in association with operating stations of the attachment machine, with portions broken away to illustrate fixture construction details;

FIG. 7 is an enlarged fragmented vertical section of a portion of the fixture, taken generally on the line 7—7 of FIG. 6;

FIG. 8 is an enlarged fragmented perspective view illustrating a cell loading station of the attachment machine;

FIG. 9 is a fragmented side elevation view of the cell loading station, with portions broken away to illustrate the construction and operation thereof;

FIG. 10 is an enlarged fragmented vertical section of a portion of a fixture at the cell loading station, taken generally on the line 10—10 of FIG. 8;

FIG. 11 is an enlarged fragmented perspective view illustrating a flux station of the attachment machine;

FIG. 12 is a fragmented side elevation view of the flux station, with portions broken away to illustrate the construction and operation thereof;

FIG. 13 is a fragmented front elevation view of a portion of the flux station, taken generally on the line 13—13 of FIG. 12;

FIG. 14 is an enlarged fragmented side elevation view of an interconnector dispensing station of the attachment machine;

FIG. 15 is an enlarged fragmented side elevation view of a portion of the dispensing station, with portions broken away to illustrate the construction and operation thereof;

FIG. 16 is a fragmented horizontal section through a portion of the dispensing station, taken generally on the line 16—16 of FIG. 15, and having portions broken away to illustrate station construction details;

FIG. 17 is a fragmented vertical section through a portion of the dispensing station, taken generally on the line 17—17 of FIG. 15, with portions broken away to illustrate operation of a station punch head;

FIG. 18 is an enlarged fragmented perspective view of a portion of a fixture supporting an interconnector at the interconnector dispensing station;

FIG. 21 is a fragmented rear elevation view of the attachment station, taken generally on the line 21—21 of FIG. 19;

FIG. 22 is an enlarged fragmented side elevation view of an exemplary inspection station of the attachment machine;

FIG. 23 is an enlarged fragmented side elevation view of a cell unloading station of the attachment machine, with portions broken away to illustrate the construction and operation thereof;

FIG. 24 is an enlarged vertical section of a portion of the cell unloading station, taken generally on the line 24—24 of FIG. 23;

FIG. 25 is a fragmented top plan view of the cell unloading station, taken generally on the line 25—25 of FIG. 23; FIG. 27 is a top plan view illustrating an alternative form of an interconnector attachment machine embodying the novel features of the invention.

DETAILED DESCRIPTION OF THE PREFERRED EMBODIMENT

Figure 1:
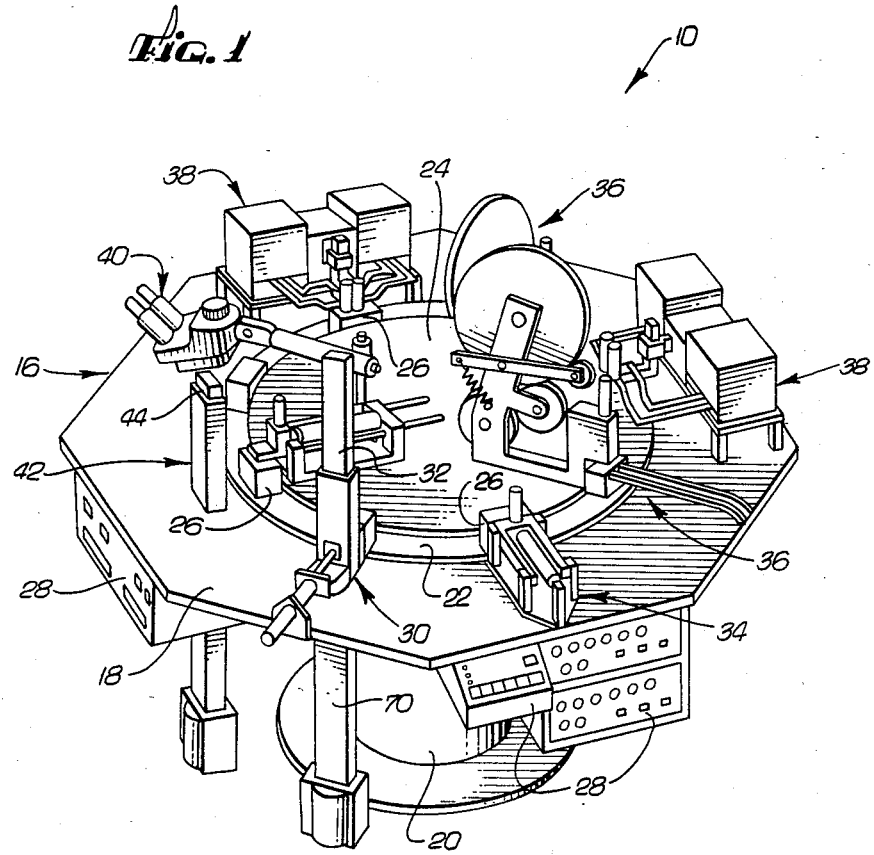
FIG. 1 is a perspective view illustrating an interconnector attachment machine embodying the novel features of the invention.

As shown in the exemplary drawings, an interconnector attachment machine referred to generally by the reference numeral 10 is provided for automated and precision placement of one or more electrically conductive interconnectors 12 (FIG. 5) onto a solar cell 14 of the type used in a solar cell array (not shown) for electrical power generation. The interconnector attachment machine 10 places and attaches the interconnectors 12 onto solar cells 14 without requiring manual handling of the solar cells or the interconnectors and further with minimum risk of damage to the fragile solar cells.

As shown in FIGS. 1 and 2, the interconnector attachment machine 10 of the present invention comprises a machine frame 16 including a lower generally ring-shaped platform 18 supported in an elevated position on a machine base 20. A turntable 22 of generally circular shape is rotatably supported by the machine base 20 in a position spaced slightly above the lower platform 18 and has an outer periphery which slightly overlaps the radially inner extent of the lower platform 18. A generally circular upper platform 24 is supported by the machine base in a position spaced slightly above the turntable 22, wherein this upper platform 24 is diametrically smaller than the turntable 22. A plurality of fixtures 26 are mounted on the turntable 22 in a generally equiangularly spaced arrangement for supporting individual solar cells in respective association with a corresponding plurality of machine operating stations arranged about the turntable periphery and supported by the lower and/or upper platforms 18 and 24. Each operating station performs automatically one of a sequence of prescribed steps required in the placement and attachment of interconnectors on the fixture-supported solar cells, after which the turntable 22 is indexed to transfer the plurality of solar cells to the next operating stations in sequence. This turntable indexing movement is responsive to the operation of a central control unit 28 suspended from the machine frame 16 below the lower platform 18 to control energization of a turntable drive motor (FIG. 26) within the machine base 20 and further to integrate and control overall machine operation. While the specific overall design and operation of this central control unit 28 is not shown or described in detail herein, a preferred control unit construction incorporates an assembly of conventional pneumatic control devices for controlling pneumatic cylinder assemblies and their rates of movement at the various operating stations of the machine. In addition, the control unit includes a turntable actuation circuit (FIG. 26), to be described in more detail, for correlating the various operating station movements with indexing of the turntable.

More particularly, with reference to the exemplary form of the invention depicted in FIG. 1, the machine operating stations comprise a cell loading station 30 at which individual solar cells are transferred from a prefilled cell loading magazine 32 one at a time onto the turntable fixtures 26 each time the turntable is indexed to a subsequent rotational position. A solar cell thus loaded at the loading station 30 is then indexed on its fixture to a flux station 34 which applies a flux material to predetermined points on the solar cell corresponding with interconnector attachment points. The flux-bearing cell is then indexed in sequence to an interconnector dispensing station 36 which places an interconnector on the cell and then to an attachment station 38 which secures the interconnector to the cell as by soldering or welding. Additional pairs of interconnector dispensing and attachment stations 36 and 38 can be provided for attachment of additional interconnectors to the solar cell, with a second pair of such stations being illustrated in FIG. 1. The resultant solar cell/interconnector subassembly is indexed to an inspection station 40 followed by movement to a cell unloading station 42 whereat the cell/interconnector subassemblies are transferred to an unloading magazine 44 for collection and ultimately for removal from the machine.

The interconnector attachment machine thus provides an integrated and substantially fully automated apparatus for placement and attachment of interconnectors 12 onto relatively fragile and relatively costly solar cells 14 without requiring manual handling of or contact with either the solar cells or the interconnectors. Continuous machine production need be interrupted only occasionally and momentarily for changeover of the loading and unloading magazines 32 and 44 as those magazines are emptied and filled, respectively, during machine operation. Such magazine changeover, however, does not require direct manual contact with the solar cells, thereby permitting manufacture of cell-/interconnector subassemblies, as viewed in FIG. 5, rapidly and in a high precision manner and with minimum risk of solar cell breakage. Moreover, the various operating stations of the machine are designed for placing the attaching interconnectors in a reliable and high precision manner thereby minimizing formation of unacceptable cell-interconnector joints and correspondingly minimizing costly formation of reject subassemblies which must be discarded or reworked.

An exemplary solar cell 14 of the type processed by the interconnector attachment machine 10 is illustrated in enlarged, somewhat exaggerated form in FIG. 3 prior to attachment of one or more interconnectors 12 thereto. This solar cell 14 is generally of the type used in the manufacture of solar cell arrays (not shown) wherein a large number of such cells are mounted side-by-side on an extended surface substrate and electrically coupled in series and in parallel to one another for controlled generation of electrical power from incident solar radiation. The solar cell 14 comprises a relatively thin sheet of a doped silicon-based semiconductor material 46 having rectangular side dimensions typically on the order of about 2 to 6 centimeters and a thickness typically on the order of about 0.002–0.01 inch (50–250 microns). The semiconductor material 46 has formed upon it an underlying metallic backing 48, typically of a highly conductive silver-based alloy or the like, covering the entire surface back of the semiconductor material. A thin and narrow conductive contact strip 50 also typically comprising a silver-based alloy is formed to extend along the top surface of the semiconductor material at a front marginal edge thereof. Additional thin conductive lines 52 are normally etched onto the otherwise exposed top surface of the semiconductor material 46 to extend rearwardly in parallel from the contact strip 50.

When its top surface is exposed to solar radiation, the semiconductor material 46 produces a relatively small electrical current and voltage. By electrically coupling the solar cell 14 with a selected number of other solar cells in an extended surface array, however, substantial and controlled electrical power generation results. The interconnectors 12 are thus attached to the contact strip 50 of each solar cell 14 as an intermediate production step in the manufacture of solar cell arrays to provide a cell/interconnector subassembly (FIG. 5) for facilitated subsequent electrical interconnection with other solar cells in a solar cell array. In this regard, as shown in FIG. 5, each interconnector 12 normally provides multiple conductive links 54, with the illustrative preferred interconnectors having a generally U-shaped configuration to provide a pair of such links 54 between a base 55, and a plurality of such interconnectors are attached to each solar cell 14 to facilitate redundant electrical coupling of the solar cell in a solar cell array. Breakage of a conductive link 54 within the array is thereby unlikely to create an open circuit, wherein such open circuits can be virtually impossible to repair particularly when the solar cell array is used as a power source for a satellite.

As shown in detail in FIGS. 8–10, the solar cells 14 requiring attachment thereto of interconnectors 12 are loaded onto the turntable fixtures 26 at the cell loading station 30 for processing in association with the various subsequent machine operating stations. More particularly, the cell loading station 30 is adapted to receive the cell loading magazine 32 which has been preloaded with a supply of the solar cells 14. In the illustrative form, this cell loading magazine comprises a vertically elongated, generally rectangular boxlike structure having closed side walls 56 and closed top and bottom walls 57 and 58. The front of the cell loading magazine 32 is open to expose vertically spaced shelves 60 on the inboard faces of the side walls 56, wherein these shelves 60 are aligned in generally horizontal pairs to define horizontal cell-receiving spaces 62 into which the solar cells individually are loaded and supported by the shelves 60. A rear wall for the magazine 32 is formed by marginal strips 64 respectively adjoining the side walls 56 and cooperating to define a vertically extending, uninterrupted rear channel 66 for reception of a reciprocal loading plate 68 forming an integral part of the cell loading station 30.

The cell loading magazine 32 is loaded into the cell loading station 30 by generally vertically oriented reception through a correspondingly shaped vertically open chamber formed by a magazine receptacle 70 mounted on the lower platform 18 in a position spaced slightly from the outer periphery of the turntable 22. Guide channels at the sides of this receptacle 70 are provided for registry with mating outboard lugs 72 on the magazine side walls 56 to insure correct magazine-receptacle alignment. The bottom wall 58 of the cell loading magazine is supported on a small ledge 73 of a lead screw nut 74 which is in turn threaded onto a vertically oriented lead screw 75 rotatably driven in a controlled manner by a small drive motor 76. Appropriate means (not shown) are provided for preventing rotation of the lead screw nut along with the lead screw 75, thereby retaining the ledge 73 in a supportive position beneath the cell loading magazine 32 for translation along the lead screw 75 when the lead screw is rotated.

The loading plate 68 is part of a pneumatic cylinder assembly 71 controlled by the central control unit 28 (FIG. 1). This pneumatic cylinder assembly 71 is supported by brackets 77 and 78 carried respectively by the lower platform 18 and the receptacle 70 at the cell loading station. More particularly, as shown best in FIGS. 8 and 9, the pneumatic cylinder assembly 71 comprises a cylinder 80 receiving one end of an outwardly projecting pneumatic ram 82 for reciprocal movement in response to the supply and exhaust of pressurized air with respect to the cylinder 80 via hoses 83. The opposite or free end of the pneumatic ram 82 carries the loading plate 68 in a generally horizontal plane projecting generally radially inwardly toward the center of rotation of the turntable 22. The loading plate 68 is vertically positioned to slide through an opening 81 in the magazine receptacle 70 and further has a width dimension to pass without interference through the rear channel 66 of the magazine 32 loaded into the receptacle 70 and further for passage through the various cell-receiving spaces 62 within the magazine.

In operation, air is supplied to the pneumatic cylinder 80 at the cell loading station 30 by the central control unit at a selected and preferably individually regulated pressure to extend the associated ram 82 at a carefully controlled rate of travel in a direction displacing the loading plate 68 through the loading magazine 32. By positioning the loading magazine for coplanar alignment of a solar cell 14 therein with the loading plate 68, a front margin 68' of the loading plate contacts a rear margin (referred to by arrow 84 in FIG. 3) of the aligned solar cell to push the solar cell outwardly through the front of the magazine 32 with the cell contact strip 50 being positioned opposite the loading plate. The loading plate 68 thereby slides the solar cell for precision placement, as will be described in more detail, onto an aligned one of the fixtures 26 on the turntable 22, at which time an upstanding tab 85 on the ram 82 contacts a limit switch 86 mounted on a portion of the bracket 78 which signals the central control unit 28 to reverse the direction of ram movement thereby retracting the loading plate 68 from the magazine 32.

When complete retraction of the loading plate 68 is achieved, the tab 85 contacts a second limit switch 87 on the bracket 78 which signals the control unit 28 to energize the lead screw drive motor 76 for a predetermined time interval. This time interval is chosen to move the lead screw nut 74 and its ledge 73 upwardly a sufficient distance to elevate the cell loading magazine 32 for alignment of the next solar cell therein with the loading plate 68 ready for loading onto a turntable fixture 22 when a subsequent empty fixture 26 is indexed to the loading station 30. In addition, the retracting tab 85 contacts and closes a state switch 79 adjacent the limit switch 87 wherein this state switch 79 is part of a turntable actuation circuit which will be described herein in more detail with respect to FIG. 26 and which prevents turntable rotation until the ram 82 is retracted to an out-of-the-way position where it will not interfere with turntable rotation.

The turntable fixtures 22 are designed for secure and precision seated support of the solar cells 14 and are mounted in a generally circular, equiangular array about the periphery of the turntable with a single fixture positioned in alignment with a respective one of the machine operating stations. Accordingly, the fixtures 26 respectively support and transport a corresponding plurality of solar cells for performance of a plurality of manufacturing steps substantially simultaneously with respect to the supported solar cells.

An exemplary turntable fixture 26 is depicted in FIGS. 6 and 7. As shown, each fixture 26 includes a lower base block 88 supporting an overlying vacuum manifold plate 89, with screws 90 or the like being provided for fastening the mainifold plate 89 and support block 88 securely onto the turntable 22 at a predetermined position about the turntable periphery. An upper support plate 92 is rested on top of the vacuum manifold plate 89 in a predetermined position by locator pins 94 projecting upwardly from the base block 88 and the manifold plate 89 and accommodating at least some vertical displacement of the support plate 92 relative to the underlying manifold plate 89, as will be described in more detail. A cell-receiving track 95 is formed in the upper surface of the support plate 92 of an appropriate width for precison reception and seated retention of a solar cell 14. Importantly, the locator pins 94 permit facilitated removal of the support plate 92 for appropriate replacement by a substitute support plate having a cell-receiving track of a different width thereby permitting processing of different solar cell sizes without requiring complete fixture substitution.

An elongated and contoured stop bar 96 is also supported on the vaccuum manifold plate 89 at a position extending across and closing the radially inner extent of the cell-receiving track 95 in the removable upper support plate 92. This stop bar is secured in any suitable and preferably conveniently removable manner to the mainfold plate 89. The stop bar 96 is contoured to include a stepped arrangement of recessed shoulders defining a recessed trough 97 running in parallel alongside the support plate 92 and an adjoining step 98 formed in a plane approximating the base of the cell-receiving channel 95. This step 98 is in turn bordered by an elongated raised rib 99 projecting to a position substantially above the base of the track 95. Laterally spaced guide posts 100 project upwardly from the stop bar trough 97 at positions generally corresponding with desired attachment sites for interconnectors, with two of said guide posts being depicted in FIG.6. Each guide post 100 is in turn associated with an adjacent pair of relatively small magnets 102 mounted generally flush with the stop bar step 98.

At the cell loading station 30, as viewed in FIGS. 8-10, the loading plate 68 pushes a solar cell 14 from the cell loading magazine 32 into the cell-receiving track 95 of the fixture 26 aligned therewith. Loading plate advancement is adjusted to continue a relatively small but substantially uninterrupted force applied to the solar cell until a leading marginal edge of the solar cell corresponding with the cell contact strip 50 contacts the upstanding guide posts 100. Engagement between the loading plate 68 and the solar cell 14 is maintained, under control of the central control unit 28, for a period of time sufficient to permit downward seating and retention of the cell 14 under the influence of a light vacuum applied to the cell underside through a vacuum conduit 104 (FIG. 9), a corresponding passage in the support block 88 (not shown), and an additional passage 106 in the manifold plate 89 (FIG. 10) leading to upwardly presented shallow manifold depressions 108 in the support block track 95, as viewed best in FIG. 6. Seal rings 109, as depicted in FIG. 10, can be provided between the various components defining the fixture vacuum passage to prevent undesired leakage.

Proper loading and placement of the solar cell 14 onto the fixture 26 at the loading station 30 is detected by detector means in the form of an optical detector 91 (FIGS. 8 and 9). In one preferred form, this optical detector 91 comprises another state switch of the turntable actuation circuit (FIG. 26) having optical signal transmission and receiver components within a detector housing 93 to transmit and receive optical signals via a probe 101 aimed at the cell-receiving track 95 near the stop bar 96 of a fixture 26 aligned at the cell loading station. When the fixture track is empty or a solar cell 14 is otherwise improperly loaded, the probe 101 transmits an optical signal which is reflected back by the at least partially reflective base of the track 95, whereupon the detector 91 signals the central control unit 28 via a conductor 103 to prohibit turntable indexing movement. However, when a solar cell 14 is properly loaded into the fixture track 95, the reflected optical signal received by the proble is substantially reduced by the less-reflective and typically dark surface of the solar cell semiconductor material 46, resulting in the detector 91 signalling the control unit to permit turtable indexing. In the event of improper loading, therefore, the detector 91 inhibits machine operation unless and until the cell is loaded properly by the machine operator.

Subsequent to proper solar cell loading onto the fixture 26 at the loading station 30, and subsequent to generally concurrent performance of processing steps on other solar cells at other operating stations, the turntable 22 is indexed by the central control unit 28 through a controlled angular increment to transfer the loaded cell 14 on its associated fixture 26 to the flux station 34. Simultaneously, other solar cells supported by the remaining fixtures at other stations are each indexed to the next operating station in succession.

At the flux station 34, as shown in FIGS. 11-13, a relatively small quantity of liquid flux material is applied to predetermined points on the solar cell 14, wherein these predetermined points correspond with desired locations for attachment of interconnectors 12. This liquid flux material, which in the preferred form constitutes any selected flux material suitable for soldering processes, functions to cleanse the predetermined points of the solar cell and further to improve heat transfer during soldering, as will be described.

More particularly, the flux station 34 includes a flux applicator head 110 in the form of a relatively short cross bar carried at the lower ends of a pair of vertical slide rods 112 depending from a horizontally movable carriage 114. A relatively small pneumatic cylinder assembly 115 is supplied with a regulated flow of pressurized air by the central control unit 28 when a solar cell 14 is indexed to the flux station to extend a ram 116 downwardly from a pneumatic cylinder 117 thereby sliding the head 110 downwardly for brief engagement with the circumferential surface 118 of a rotatable flux material dispensing drum 120. Air hoses are coupled to the pneumatic cylinder 117 for reversible movement of the ram 116, but these air hoses are not shown in the drawings with respect to the cylinder 117 or other pneumatic cylinders to be described subsequently.

The flux material dispensing drum 120 is supported on a spindle 121 within an upwardly open tank 122 and partially submerged within a bath 124 of the liquid flux material contained within the tank 122. The drum spindle 121 extends from one end of the tank and is connected through drive gears 126 to a small drive motor 127 which rotates the drum within the bath thereby maintaining the drum exterior surface continuously wetted with the flux material.

The flux applicator head 110 includes, as shown best in FIGS. 12 and 13, a laterally spaced pair of applicator tabs 128 of an elastomeric material or the like. These applicator tabs briefly contact the wetted drum surface 118 and thus pick up a small quantity of the liquid flux material. The pneumatic cylinder assembly 115 is then directionally reversed by the central control unit to retract the flux applicator head 110 and the now-wetted tabs 128 upwardly from the rotating drum 120.

Return of the flux applicator head 110 to an initial position spaced above the rotating drum 120 is indicated by actuation of a switch 130 which signals the central control unit to initiate operation of an additional pneumatic cylinder assembly 131. This pneumatic cylinder assembly 131 comprises a pneumatic cylinder 132 supported on a station frame 134 mounted on the lower platform 18 and a controlled extensible ram 136 having a distal end secured to the movable carriage 114 which in turn supports the flux applicator head 110. As shown in FIG. 11, this movable carriage 114 comprises a generally U-shaped structure with wings 114' slidably received over guide rods 138 on the station frame 134.

Extension of the ram 136 of the pneumatic cylinder assembly 131 translates the flux applicator head 110 and the flux-wetted tabs 128 to a position over the adjacent fixture-supported solar cell 14, wherein this position is depicted by the dotted line representation in FIG. 12. When the fully extended ram position is reached, the carriage wings 114' at one side of the carriage contact a limit switch 139 which signals the central control unit of the machine 10 to temporarily halt movement of the ram 136 while the other pneumatic cylinder assembly 115 is controllably operated to descend the flux applicator 110 in a manner contacting two predetermined points on the solar cell 14 with the applicator tabs 128. This contact is maintained briefly to accomplish a desired flux wetting of the solar cell, after which the applicator head 110 is retracted upwardly ultimately actuating the position indicating microswitch 130. The carriage 114 is then retracted by the pneumatic cylinder assembly 131 to the original position as depicted by the solid lines in FIG. 12, at which time the carriage wings 114' contact a second limit switch 137 which signals the control unit to halt movement of the ram 136. The flux-bearing solar cell 14 on the fixture 26 is then ready for indexing to the next operating station in sequence, namely, the first interconnector dispensing station 36. Importantly, however, a position indicating state switch 129 adjacent the switch 130 is associated with the flux applicator head 110 is connected in the turntable circuit (FIG. 26) in series with the switch 79 and the detector 91 at the cell loading station such that, in the event of malfunction preventing movement of the head 110 to its upper position, turntable indexing will be inhibited until the malfunction is corrected, notwithstanding proper cell loading at the loading station 30.

The interconnector dispensing station 36 generally includes a supply of the interconnectors 12 together with means for controllably supplying those interconnectors to solar cells indexed into association with the dispensing station, and further including means for placing the supplied interconnectors in a precision manner onto the solar cells. In the preferred form of the invention, the interconnector supply and placement means are designed or handling the interconnectors provided in the form of an elongated ribbon 140 of electrically conductive material, such as Invar ribbon which may be silver-plated, as shown in FIG. 4. More particularly, this ribbon 140 comprises a pair of longitudinally extending drive strips 142 having transversely aligned pairs of drive holes 143 formed therein at predetermined intervals. The two drive strips 142 are formed integrally with a plurality of the interconnectors 12, formed typically by an appropriate die cutting and/or stamping process such that the interconnectors 12 are carried between the drive strips 142 on thin support tips 144 extending toward each other from the drive strips, with a longitudinal spacing between the interconnectors 12 corresponding with the longitudinal spacing between drive holes 143 in the drive strips 142.

As shown in FIGS. 14–17, the ribbon 140 of interconnectors 12 is wound about and carried upon a supply reel 146 carried rotatably on an upstanding support bracket 148 mounted on the upper platform 24. A protective paper film 141 overlying the ribbon 140 is also conveniently threaded onto the reel 146. The ribbon 140 is threaded from the supply reel 146 behind an idler pulley 150 carried by the support bracket 148 and then in front of an actuator arm 151 of a tension control switch 152 also carried on the bracket 148. The ribbon 140 is passed further downwardly beyond the tension switch actuator arm 151 over a rolling guide reel 154 on the support bracket for threaded reception into a channel-shaped track 156 formed in a dispenser guide block 158 mounted on the upper platform 24. The paper film 141 is separated from the ribbon 140 and is wound onto a take-up reel 145 driven with the supply reel 146 by a pulley belt 147 connected between the reels.

Within the track 156 of the dispenser guide block 158, the ribbon 140 passes over an underlying reciprocal slide bar 160 having a pair of laterally spaced drive pins 162 projecting upwardly for driving reception into a pair of the holes 143 in the ribbon drive strips 142. These drive pins 162, as shown best in FIG. 15, are angled to extend from slightly below the ribbon 140 to a point generally at or slightly above the ribbon in a direction toward the periphery of the turntable 22. A pneumatic cylinder assembly 164 operated by the central control unit 28 includes a ram 163 extensible from a cylinder 165, wherein the ram 163 is connected to a side arm 166 of the slide bar 160 to advance the ribbon 140 engaged with the drive pins 162 through an incremental distance corresponding with one interconnector spacing along the ribbon length, followed by return retraction of the ram 163 to slide the drive pins beneath the ribbon for reception into a subsequent pair of the drive strip holes 143. Reverse ribbon movement within the track 156 is prevented by a pair of spring arms 170 mounted on the top of the guide block 158 with depending spring fingers 171 angled oppositely with respect to the drive pins 162 and received into a different pair of the drive strip holes 143.

The above-described ribbon advancement apparatus comprises a ratchet drive assembly which advantageously advances the ribbon 140 in controlled increments under a relatively low, controlled ribbon tension. More particularly, as viewed in FIG. 14, increases in ribbon tension above a predetermined threshold causes the ribbon 140 to bear against and displace the actuator arm 151 of the tension control switch 152 toward an illustrative dotted line position. This tension control switch 152 is in turn appropriately coupled with a small drive motor 174 carried at one end of a pivoted support link 175 which in turn is urged by a spring 176 to hold a resilient roller 177 driven by the motor 174 in bearing engagement with the outer circumference of the ribbon supply reel 146. Energization of the small motor 174 rotates the roller 177 in a direction feeding the ribbon 140 toward the guide block 158 to relieve ribbon tension and thereupon shift the actuator arm 151 to deenergize the motor 174. Accordingly, ribbon binding or breakage in association with the ratchet drive assembly is substantially completely avoided to insure proper ribbon advancement at all times.

Figures 14, 18:
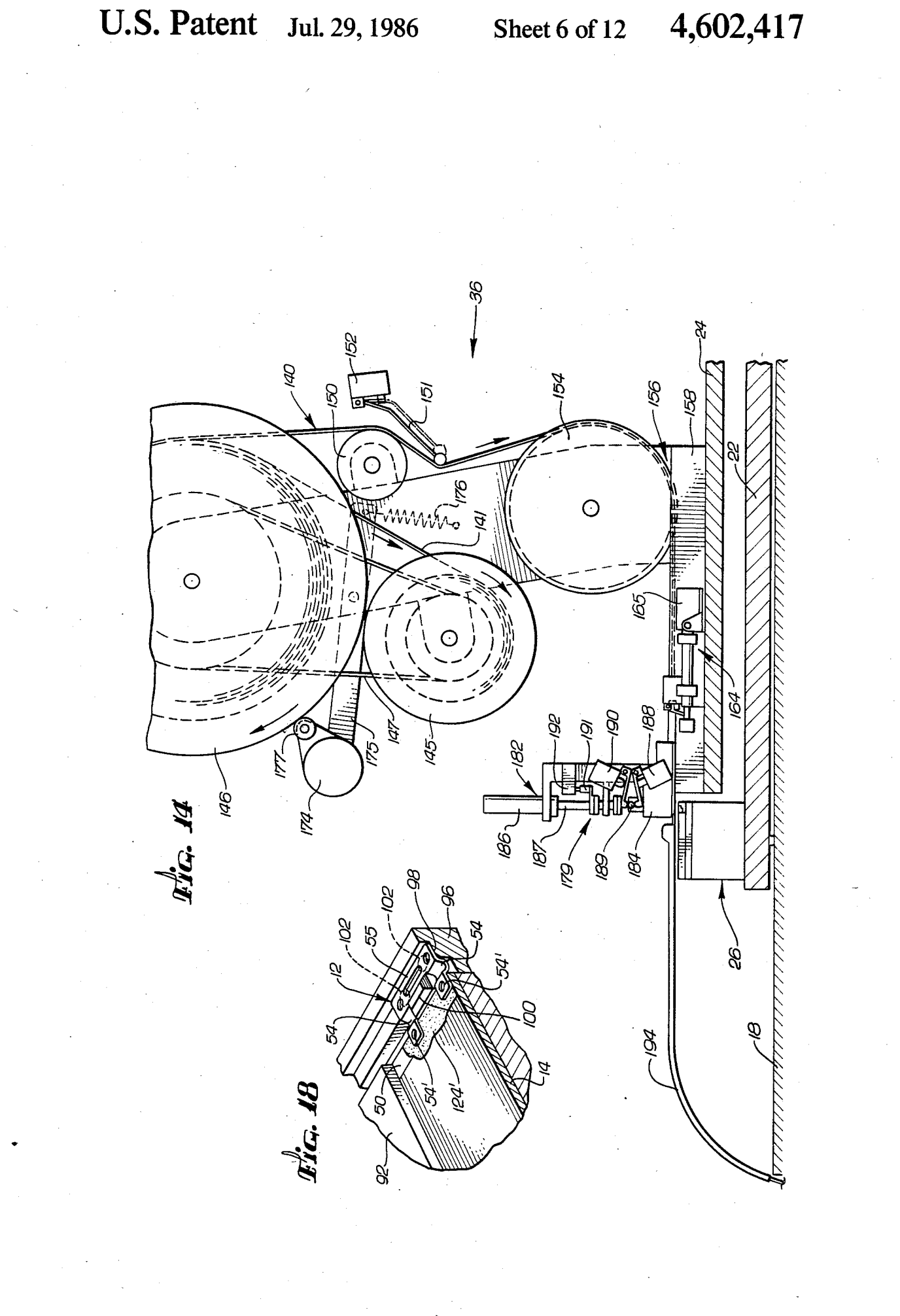

When a flux-bearing solar cell 14 is indexed on a fixture 26 to he interconnector dispensing station 36, a punch head 180 of a punch unit 179 is descended by operation of a pneumatic cylinder assembly 182, as controlled by the central control unit 28. This punch head 180 is shown in FIGS. 16 and 17 to have a lower punch die 181 of generally U-shaped cross-sectional configuration including two lower knife edges 183 for guided passage through punch block 184 and further through a shear plate 185 carried by the punch block immediately above an aligned interconnector 12 along the ribbon 140. The punch die 181 shears the interconnector 12 from the ribbon by appropriate cutting between the ends of the interconnector links 54 and the drive strip support tips 144. Moreover, the die head 181 guides the now-separated interconnector 12 to fall downwardly from the punch block 184 through the shear plate 185 for placement onto the solar cell 14. As shown in FIG. 18, the interconnector 12 is placed with the free ends of its two links 54 lying upon a flux-wetted portion 124' of the solar cell contact strip 50 and on opposite sides of one of the guide posts 100. In addition, the base 55 of the U-shaped interconnector 12 is placed onto the step 98 of the stop bar 96 where it is firmly seated by the attractive action of the two small magnets 102.

When the die head 181 reaches a fully descended position, a limit switch 188 (FIG. 14) is struck by a position pin 189 on a ram 187 of the pneumatic cylinder assembly 182, wherein this ram 187 carries the punch head 180. The limit switch 188 signals the central control unit 28 to reverse the direction of movement of the pneumatic cylinder assembly 182. Such reversed movement returns the punch head 180 and die 181 in an upward direction while retracting the ram 187 into its cylinder 186 where it stops at an upper position controlled by the position pin 189 engaging a second limit switch 190, wherein this second switch 190 signals the control unit to initiate operation of the ratchet drive assembly to advance a subsequent interconnector on the ribbon into aligned relation below the punch head 180. Such advancing movement in preparation for the next solar cell in sequence slides the expended drive strips 142 from which interconnectors have been removed through a chute 194 into an appropriate collection receptacle (not shown). Moroever, a state switch 192 on the punch block 184 is desirably connected in series with the previously described state switches at the loading and flux stations 30 and 34 wherein the latter switch 192 is positioned for contact by a tab 191 on the punch head 180 to prohibit turntable indexing unless the punch head 180 is lifed to its elevated position.

Figure 19:
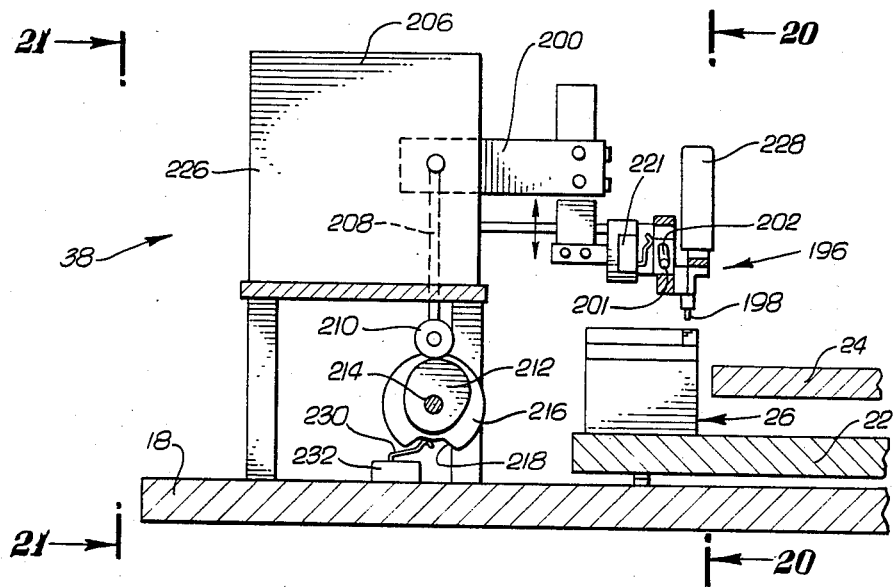
FIG. 19 is an enlarged fragmented side elevation view of an interconnector attachment station of the attachment machine.
Figure 20:
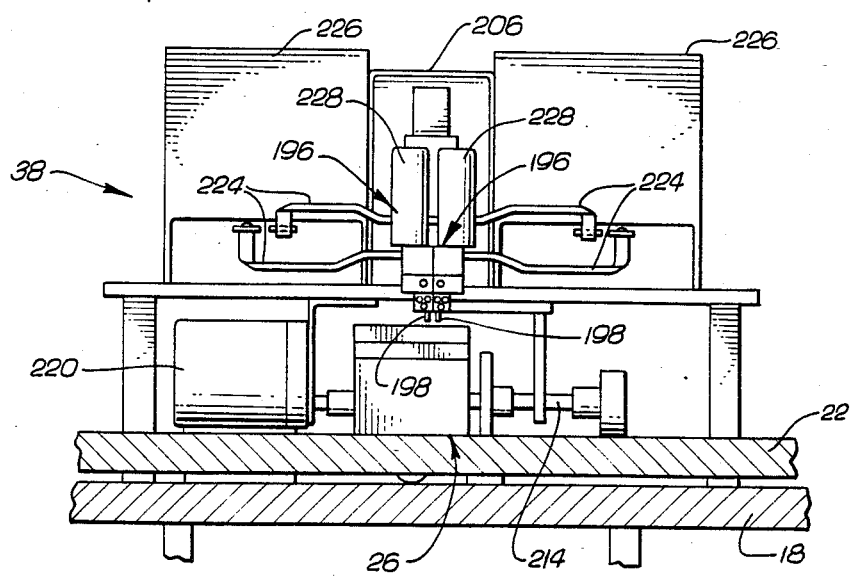
FIG. 20 is a fragmented front elevation view of the attachment station, taken generally on the line 20—20 of FIG. 19.

With an interconnector 12 placed and supported on the solar cell 14, as viewed in FIG. 18, the supporting fixture 26 is indexed by the turntable 22 to the next operating station in sequence, namely, the attachment station 38, as viewed in FIGS. 19–21. This attachment station 38 includes a pair of reflow solder heads 196 each including a solder electrode 198, wherein the solder heads 196 are mounted on a common head frame 200 for lowering the electrodes 198 into soldering contact with the two conductive links 54 of the interconnector 12 (FIG. 18) at points generally corresponding with small openings 54' in those links positioned to overlie the conductive strip 50 on the solar cell 14. In this manner, the attachment station 38 functions to attach or connect the interconnector 12 to the solar cell 14 thereby providing a cell/interconnector subassembly. Alternatively, while such attachment is described herein in a preferred form by reflow soldering techniques, alternative attachment methods such as welding can be used as desired.

The solder heads 196 include oppositely extending spindles 201, one of which is viewed in FIG. 19, received loosely within vertically enlarged slots 202 at a distal end of the frame 200. The opposite end of this frame 200 in constrained within a housing 206 for vertical movement in accordance with the position of a vertically movable cam follower link 208 having a lower roller 210 in contact with a generally elliptical cam 212. This elliptical cam 212 is in turn carried on a drive shaft 214 for rotation therewith along with a switching cam 216 having a generally circular periphery interrupted by a small peripheral notch 218.

The cam drive shaft 214 is rotatably driven by a drive motor 220 wherein such drive motor operation is initiated by the central control unit when an interconnector-supporting solar cell 14 is indexed on a fixture 26 to the attachment station. Drive motor rotation correspondingly rotates the elliptical cam 212 which is followed by the cam follower link 208 resulting in lowering of the solder head frame 200. This lowering movement brings the soldering electrodes 198 into contact with the links 54 of the supported interconnector 12, with further downward frame arm movement being accommodated by the enlarged slots 202. Upon such further downward frame arm movement, the solder heads 196 remain stationary to actuate microswitches 221 (one of which is illustrated in FIG. 19) acting between the frame 200 and the two solder heads 196 to couple the solder heads through electrical conductors 224 for a brief interval to associated respective power supplies 226 mounted on the lower platform 18 of the machine. The power supplies 226 heat the electrodes 198 to solder the interconnector links 54 onto the solar cell conductive strip 50, with a controlled soldering force being applied by weights 228 on the solder heads 196.

Continued rotation of the elliptical cam 212 eventually moves the head frame 200 in an upward direction to lift the solder heads 196 from the underlying cell-interconnector subassembly. This lifing motion continues until an actuator 230 of a microswitch 232 is received into the small notch 218 in the switching cam 216 thereby deenergizing the drive motor 220 until a subsequent interconnector-bearing solar cell is transferred to the attachment station. The formed cell/interconnector subassembly is then ready for indexing to the next station in sequence, subject to appropriate positioning of the switches 221 on the head frame 200, at least one of which constitutes a state switch connected in series with the above-discussed state switches at the cell loading, flux, and interconnector attachment stations to prohibit turntable indexing in the event of malfunction failing to elevate the solder heads 196.

The cell-interconnector subassembly including one attached interconnector 12 is indexed to additional interconnector dispensing and attachment stations 36 and 38, in sequence, in the event attachment of additional interconnectors is desired. For example, in the illustrative form of the invention depicted in FIGS. 1 and 2, a second interconnector dispensing station 36 is provided subsequent to the first attachment station for placing a second interconnector 12 onto the solar cell 14 in nested association with the second of the two guide posts 100. The turntable 22 is then indexed again to transfer this subassembly to a second attachment station 38 at which the second interconnector 12 is attached to the solar cell. These second interconnector dispensing and attachment stations 36 and 38 are respectively identical with the first dispensing and attaching stations described hereinabove, except, of course, the second stations are appropriately mounted on the lower and upper machine platforms 18 and 24 for respective placement and attachment of the second interconnector in a slightly different position on the solar cell, namely, about the second guide post 100.

When the final interconnector 12 has been attached to the solar cell at the final attachment station 38, the resultant cell/interconnector subassembly is indexed by the turntable 22 to the inspection station 40 illustrated generally in FIG. 22. At this inspection station 40, a viewing assembly 234 which may comprise a microscope is supported on a stand 235 mounted in a convenient manner on the upper platform 24 with optical components aligned over the cell/interconnector subassembly and focused upon the solder joints formed between the interconnector links 54 and the cell contact strip 50. In a typical subassembly inspection, these solder joints are observed visually to assure that reflow solder substantially fills the relatively small holes 54' in the interconnector links 54 thereby providing a solidly anchored solder joint. Cell/interconnector subassemblies having defective or otherwise unsatisfactory solder joints can be removed from the fixture 26 for appropriate disposal or rework, as required.

The inspected cell/interconnector subassembly is then transferred by the turntable 22 to the cell unloading station 42 at which the subassembly is automatically removed from the machine 10 and placed into the cell unloading magazine 44. More specifically, as shown in FIGS. 23-25, indexing movement of a fixture 26 to the cell unloading station 42 moves a cam roller 246 at the underside of the fixture 26 to engage and roll up upon a short cam step 248 formed on the lower platform 18 beneath the turntable 22. This cam step 248 thereby causes the cam roller 246 to move slightly in an upward direction for purposes of lifting a U-shaped bridge 250 (FIG. 24) which extends upwardly through passages 251 and 252 formed respectively in the fixture block 88 and manifold plate 89 and which is connected to the underside of the fixture support plate 92 by bolts 253. Springs 245 within counterbores 247 in the block 88 compress between tabs 249 on the bridge 250 and the underside of the manifold plate 89 to accommodate upward movement of the bridge and the support plate 92 while applying a downward force to the support plate 92 for return and retention to a position seated on the manifold plate throughout other regions of turntable indexing. The support plate 92 is thus lifted slightly by the bridge 250 from the manifold plate 89 a sufficient distance, typically a few thousandths of an inch, in accordance with the height of the cam step 248 to separate the support plate 92 from the manifold plate 89 and thereby break the slight vacuum acting on the underside of the supported solar cell 14. With the fixture vacuum interrupted, a pick-up head 254 is lowered by a pneumatic cylinder assembly 256 operated by the central control unit into pick-up engagement with the upper side of the cell/interconnector subassembly. This pick-up head 254 includes a series of internal passages 258 which are downwardly open through a resilient shoe 260 and are adapted for connection in any convenient manner by the central control unit to a source of light vacuum to pick up the subassembly when the resilient shoe 260 is lowered into engagement therewith. Lifting of the subassembly is accomplished by reverse directional operation of the pneumatic cylinder assembly 256, including a cylinder 257 with a reciprocal ram 259 which lifts the head 254 into spaced relation above the underlying fixture 26.

When an upper position of the head 254 is reached, as indicated by a tab 262 on the head striking a switch 264 on a station carriage 266, a second pneumatic cylinder assembly 268 on an upper platform frame 267 and supporting the carriage 266 advances a ram 269 from within a cylinder 270 to move the the pick-up head 254 toward the unloading magazine 44. Importantly, this unloading magazine is identical structurally with the loading magazine 32 and is supported within a receptacle 271 mounted on the lower platform 18 in a position for direct movement of the pick-up head 254 horizontally to a position carrying the subassembly into an open cell-receiving space 62 between opposing pairs of side shelves 60. When this position is reached, the vacuum within the pick-up head 254 is relieved, as by appropriate coupling of the pick-up head passages 258 by the control unit to a slight pressure source, to release the solar cell/interconnector subassembly within the magazine 44. This release of the vacuum can be triggered by the control unit upon contact of a tab 274 movable with the carriage 266 along slide rods 275 into contact with a limit switch 276 on the frame 267.

The pick-up head 254 is then retracted by the pneumatic cylinder assembly 268 to its initial position elevated over a fixture 26. This retraction movement is terminated by the control unit upon contact between the tab 274 with a second limit switch 277, wherein this limit switch also signals the control unit to energize a small drive motor 278 for lowering the unloading magazine 44 one spatial increment for reception of a subsequent cell/interconnector subassembly. This drive motor energization occurs for a predetermined time interval to rotate a lead screw 282 in a direction translating a lead screw nut 283 thereon in a downward direction. This lead screw nut 283 includes a support ledge 284 for the unloading magazine 44 such that the magazine is correspondingly lowered.

The now-emptied fixture 26 at the cell unloading station 42 is ready for indexing to the cell loading station 30 for receiving a subsequent solar cell to which interconnectors 12 are to be attached. Such indexing motor is prohibited, however, in the event of station malfunction by a state switch 285 (FIG. 24) coupled in series with the above-discussed state switches at other stations and which must be closed by contact with the pick-up head tab 262 before the turntable can be indexed.

Figure 26:
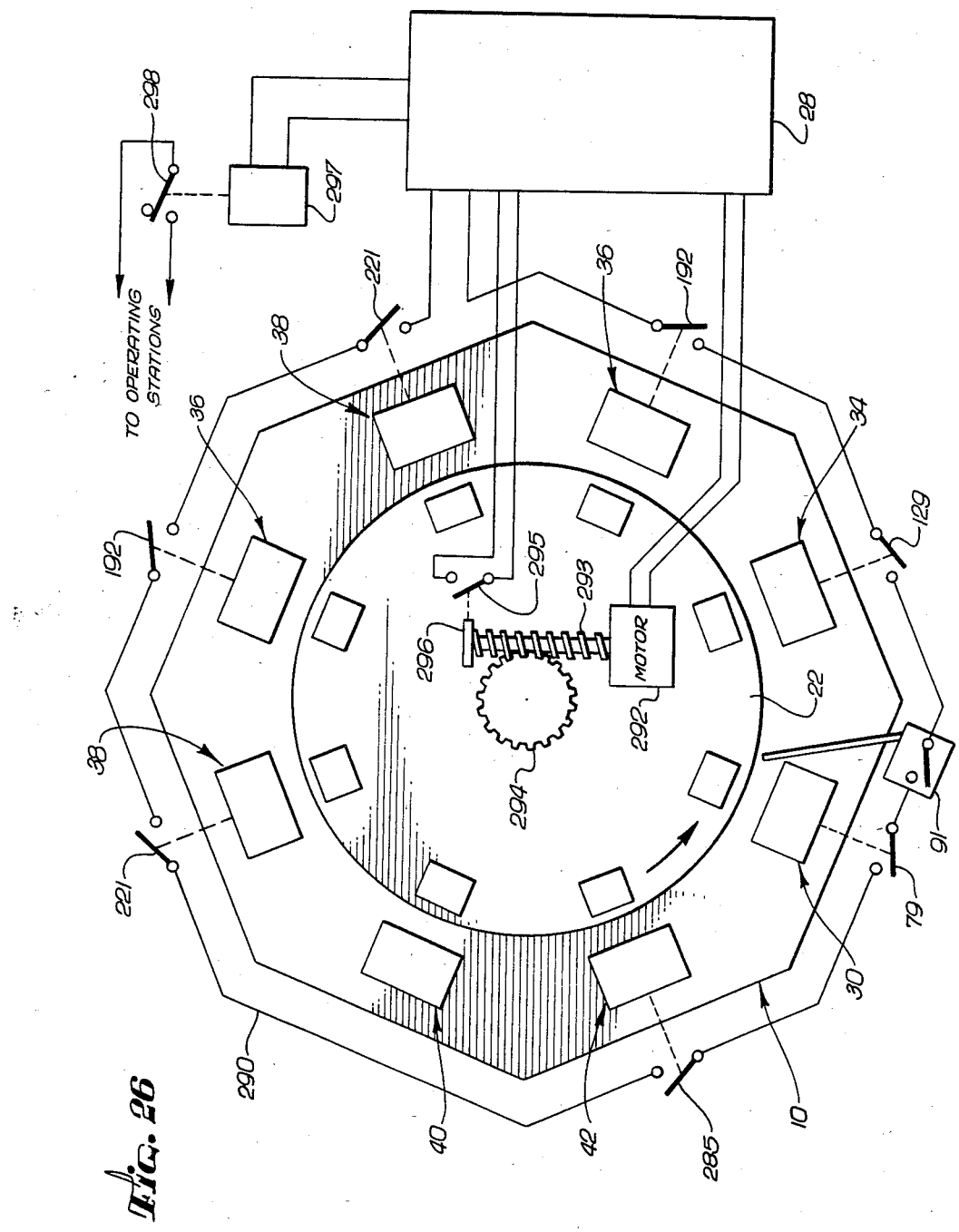
FIG. 26 is a diagrammatic view illustrating a portion of a central control unit for the machine including a turntable actuation circuit having state switches at various machine operating stations.

FIG. 26 is a diagrammatic illustration of the interconnector attachment machine 10 and its various operating stations in conjunction with the central control unit 28. As depicted, the central control unit 28 includes the turntable actuation circuit 290 comprising a conductor interrupted at intervals by the state switches 79, 91, 129, 192, and 221 at the various operating stations and which are closed when their respective station components are returned to an initial out-of-the-way position not interferring with turntable rotation. When all the these state switches are closed, indicating completion of operating steps at all of the operating stations, the actuation circuit 290 is closed resulting in signalling of the control unit 28 to initiate operation of a turntable drive motor 292. This drive motor 292, as depicted in FIG. 26, rotates the turntable 22 as by gears 293 and 294 through a predetermined increment, at the conclusion of which a motor disable switch 295 is closed by a tab 296 or the like movably driven by the motor 292 to signal the control unit to deenergize the motor 292.

When the turntable drive motor 292 is turned off, appropriate time delay circuitry within the control unit prevents subsequent turntable indexing until a relay 297 is actuated to close a station operation switch 298 for initiating component movement at the various operating stations. When this occurs, one or more of the state switches are opened thereby preventing turntable rotation unless and until all station procedures are completed, as indicated by closure of all of the state switches. As discussed previously, in the preferred form of the invention, these component movements are in response to pneumatic control including air flow regulator and adjustment means for supplying independently regulated flows of pressurized air to the various pneumatic cylinder assemblies at the operating stations. The component movements at each station thus proceed essentially independent of movement at other stations, with the state switches prohibiting turntable rotation until all of the stations finish their operating cycles.

The interconnector attachment machine 10 of this invention thus provides an integrated and automated apparatus for placement of interconnectors 12 onto solar cells 14 in a precision manner without requiring manual handling of either component. Risk of breakage, chipping, or cracking of the fragile solar cells and risk of formation of unsatisfactory cell-interconnector solder joints is minimized and substantially eliminated to provide high quality production of cell/interconnector subassemblies in a manner conducive to relatively rapid production rates. For example, in a typical machine operating environment using operating stations functioning in the manner described above, the turntable 22 can be programmed by the central control unit 28 to remain stationary with solar cells 14 supported at the various operating stations for an interval of about three seconds. This short interval has been found to be sufficient for safe performance of the requisite procedures at each operating station, after which the turntable 22 is indexed to the next stationary position at a speed chosen to be as rapid as possible, typically about one second. Accordingly, with a resultant machine cycle time of about four seconds between successive turntable indexing movements, the machine 10 can be operated at a production rate on the order of about fifteen cell/interconnector subassemblies per minute.

An alternative form of the invention is illustrated in plan view in FIG. 27 which depicts a modified interconnector attachment machine 10' having an increased number of operating stations, with portions corresponding with those described above being referenced by corresponding primed reference numerals. More particularly, this modified machine 10' includes a cell loading station 30' identical with that described above with respect to FIGS. 8 and 9. Solar cells 14 loaded onto a fixture 26' at this cell loading station 30' are transferred by a turntable 22' to a flux station 34' appropriately adapted to deposit liquid flux material on the solar cell at three predetermined points corresponding with desired points of attachment for interconnectors. The flux station 34' is followed by three sequenced pairs of interconnector dispensing and attachment stations 36' and 38' for placing and attaching interconnectors at the three predetermined flux-wetted points on the solar cell. Subsequent to the final attachment station 38', the resultant cell-interconnector subassembly is transferred to an inspection station 40' which may include visual inspection means as depicted in FIG. 22, or which may include appropriate programmed electronic scanning means 234' for automatically inspecting each subassembly and signalling a programmed controller 300 to appropriately indicate whether the inspected subassembly should be accepted or rejected.

The controller 300 is coupled through the central control unit (not shown in FIG. 27) for the machine to appropriately control unloading of the cell/interconnector subassemblies to one of two successive unloading stations 42' and 42" which respectively receive rejected subassemblies and acceptable subassemblies. These unloading stations 42' and 42" are both structurally and functionally identical with the unloading station 42 described with respect to FIGS. 23-25. However, the programmed controller 300 and the central control unit for the machine cooperate to select which one of these two unloading stations will receive a given cell/interconnector subassembly. The machine 10' thus automatically separates rejected subassemblies without manual handling for subsequent repair or rework while automatically transferring accepted subassemblies to a separate unloading station for collection and ultimate removal from the machine.

A wide variety of further modifications and improvements to the interconnector attachment machine 10 described herein are believed to be apparent to one of ordinary skill in the art. For example, the number of machine operating stations particularly with regard to the number of interconnectors attached to a solar cell can be varied as desired. Moreover, multiple inspection stations can be provided for individual inspection of attached interconnectors or for individual inspection of cell-interconnector solder joints, in lieu of the single inspection stations described above. Accordingly, no limitation on the invention is intended, except by way of the appended claims.

What is claimed is:

1. A machine for attaching interconnectors onto solar cells and the like, comprising:

a machine frame;

a turntable supported for rotation relative to said frame;

a plurality of operating stations on said frame and arranged generally about the periphery of said turntable;

a plurality of fixtures mounted on said turntable in a generally equiangular arrangement about the periphery thereof for sequential alignment with each of said operating stations, each of said fixtures including means for supporting a solar cell in sequential association with said operating stations;

means for rotating said turntable in increments to index said fixtures into alignment with the next respective operating station in sequence;

said operating stations comprising a loading station for loading a cell onto each fixture indexed thereto, a flux station for applying a flux material to each fixture-supported cell indexed thereto, an interconnector attachment station for placing an interconnector on each flux-bearing cell indexed thereto on one of said fixtures, an attachment station for attaching the interconnector to the cell of each interconnector bearing cell indexed thereto on one of said fixtures to form a cell/interconnector subassembly, and an unloading station for unloading each cell/interconnector subassembly indexed thereto on one of said fixtures; and each of said fixtures comprising a fixture support plate having a track oriented in a generally radial direction of said turntable for receiving a solar cell at said loading station, a stop bar at the radially inner end of said track, a base block secured to said turntable and mounting said support plate for movement between a first position wherein said plate is seated on said base block and a second position wherein said plate is spaced slightly above said base block, vacuum means for applying a retention vacuum to the cell positioned in said track to retain the cell in a predetermined loaded position throughout indexing movement of said turntable comprising a vacuum manifold formed cooperatively by said support plate and base block when said support plate is in said first position and opening to the underside of the cell in said predetermined loaded position, and vacuum breaker means comprising means for lifting said support plate to said second position at said unloading station to open said vacuum manifold and thereby remove the retention vacuum acting upon the underside of the solar cell.

2. The machine of claim 1 wherein said vacuum breaker means comprises a first cam member on said support plate and a second cam member on said frame at said unloading station, said first and second cam members engaging one another at said unloading station and cooperating to move said support plate to said second position.

3. The machine of claim 1 including an inspection station having means for viewing cell/interconnector subassemblies indexed thereto.

4. A machine for attaching interconnectors onto solar cells and the like, comprising:

a machine frame;

a turntable supported for rotation relative to said frame;

a plurality of operating stations on said frame and arranged generally about the periphery of said turntable;

a plurality of fixtures mounted on said turntable in a generally equiangular arrangement about the periphery thereof for sequential alignment with each of said operating stations, each of said fixtures including means for supporting a solar cell in sequential association with said operating stations;

means for rotating said turntable in increments to index said fixtures into alignment with the next respective operating station in sequence;

said operating stations comprising a loading station for loading a cell onto each fixture indexed thereto, a flux station for applying a flux material to each fixture-supported cell indexed thereto, an interconnector attachment station for placing an interconnector on each flux-bearing cell indexed thereto on one of said fixtures, an attachment station for attaching the interconnector to the cell of each interconnector bearing cell indexed thereto on one of said fixtures to form a cell/interconnector subassembly, and an unloading station for unloading each cell/interconnector subassembly indexed thereto on one of said fixtures; and said flux station comprising a flux applicator head having at least one applicator tab, a tank for containing a bath of a liquid flux material, a drum rotatably driven in a position with its exterior surface partially within the bath, first means for descending said head to move said tab into contact with a flux-wetted portion of the exterior surface of said drum and then for retracting said head and tab upwardly from said drum, second means for moving said head and tab from an initial position generally above said drum to an extended position generally above a cell supported by one of said fixtures indexed to said flux station, said first means being for descending said head to move said tab into contact with a predetermined point on the cell and then for retracting said head and tap upwardly from the cell, said second means being for thereupon retracting said head and tab to said initial position generally above said drum.

5. The machine of claim 4 wherein said head has a plurality of said applicator tabs.

6. The machine of claim 4 wherein said applicator tab is formed from an elastomeric material.

7. The machine of claim 4 including means for preventing rotation of said turntable unless said head is retracted upwardly from the cell.

8. The machine of claim 4 wherein said first and second means comprise first and second fluid cylinder assemblies, said second cylinder assembly being coupled between said frame and a carriage supporting said first cylinder assembly for movement between said initial and extended positions, said first cylinder assembly supporting said flux applicator head for generally vertical reciprocation relative to said carriage.

9. A machine for attaching interconnectors onto solar cells and the like, comprising:

a machine frame;

a turntable supported for rotation relative to said frame;

a plurality of operating stations on said frame and arranged generally about the periphery of said turntable;

a plurality of fixtures mounted on said turntable in a generally equiangular arrangement about the periphery thereof for sequential alignment with each of said operating stations, each of said fixtures including means for supporting a solar cell in sequential association with said operating stations;

means for rotating said turntable in increments to index said fixtures into alignment with the next respective operating station in sequence;

said operating stations comprising a loading station for loading a cell onto each fixture indexed thereto, a flux station for applying a flux material to each fixture-supported cell indexed thereto, an interconnector attachment station for placing an interconnector on each flux-bearing cell indexed thereto on one of said fixtures, an attachment station for attaching the interconnector to the cell of each interconnector bearing cell indexed thereto on one of said fixtures to form a cell/interconnector subassembly, and an unloading station for unloading each cell/interconnector subassembly indexed thereto on one of said fixtures; and said interconnector dispensing station comprising a supply reel supporting a ribbon of interconnector material having preformed interconnectors spaced along the length thereof, means for advancing said ribbon to position one interconnector over a flux-bearing cell on each fixture indexed to said dispensing station, and a punch for separating said one interconnector from said ribbon and placing the separated interconnector on the underlying cell at a predetermined point on the cell while the latter remains stationary at said dispensing station.

10. The machine of claim 9 wherein each of said fixtures includes at least one upstanding guide post adjacent one edge of the cell loaded thereonto, said guide post assisting in the alignment of the interconnector placed onto a cell at said dispensing station.

11. The machine of claim 10 wherein each of said fixtures includes at least one magnet generally adjacent one edge of the cell loaded thereonto, said magnet assisting in the retention of the interconnector placed onto a cell at said dispensing station.

12. A machine for attaching interconnectors onto solar cells and the like, comprising:

a machine frame;

a turntable supported for rotation relative to said frame;

a plurality of operating stations on said frame and arranged generally about the periphery of said turntable;

a plurality of fixtures mounted on said turntable in a generally equiangular arrangement about the periphery thereof for sequential alignment with each of said operating stations, each of said fixtures including means for supporting a solar cell in sequential association with said operating stations;

means for rotating said turntable in increments to index said fixtures into alignment with the next respective operating station in sequence;

said operating stations comprising a loading station for loading a cell onto each fixture indexed thereto, a flux station for applying a flux material to each fixture-supported cell indexed thereto, an interconnector attachment station for placing an interconnector on each flux-bearing cell indexed thereto on one of said fixtures, an attachment station for attaching the interconnector to the cell of each interconnector bearing cell indexed thereto on one of said fixtures to form a cell/interconnector subassembly, and an unloading station for unloading each cell/interconnector subassembly indexed thereto on one of said fixtures; and said interconnector dispensing station comprising a supply reel supporting a ribbon of interconnector material having a progression of the interconnectors formed along the length thereof and a pair of perforated drive strips extending along opposite sides of and connected to said progression of interconnectors, means for advancing said ribbon to position one interconnector generally over a flux-bearing cell each time one of said fixtures is indexed to said dispensing station, and said advancing means comprising a guide block having a channel-shaped track extending generally toward a flux-bearing cell supported at said dispensing station, a ratchet drive assembly for advancing said ribbon in steps along said guide block track, and means for feeding said ribbon from said supply reel to said guide block track with a controlled, relatively low tension.

13. The machine of claim 12 wherein said tension controlled feeding means comprises a tension control switch including an actuator contacting said ribbon between said supply reel and said guide block for movement in response to ribbon tension, and a drive motor operated by said tension control switch to rotate said supply reel in a direction relieving ribbon tension when ribbon tension reaches a predetermined magnitude.

14. A machine for attaching interconnectors onto solar cells and the like, comprising:

a machine frame;

a turntable supported for rotation relative to said frame;

a plurality of operating stations on said frame and arranged generally about the periphery of said turntable;

a plurality of fixtures mounted on said turntable in a generally equiangular arrangement about the periphery thereof for sequential alignment with each of said operating stations, each of said fixtures including means for supporting a solar cell in sequential association with said operating stations;

means for rotating said turntable in increments to index said fixtures into alignment with the next respective operating station in sequence;

said operating stations comprising a loading station for loading a cell onto each fixture indexed thereto, a flux station for applying a flux material to each fixture-supported cell indexed thereto, an interconnector attachment station for placing an interconnector on each flux-bearing cell indexed thereto on one of said fixtures, an attachment station for attaching the interconnector to the cell of each interconnector bearing cell indexed thereto on one of said fixtures to form a cell/interconnector subassembly, and an unloading station for unloading each cell/interconnector subassembly indexed thereto on one of said fixtures; and said attachment station including at least one reflow solder head having an electrode, means for engaging said electrode with an interconnector supported on each fixture indexed to said attachment station and energizing said electrode to join the interconnector to the solar cell on the fixture, thereby to form a cell- /interconnector subassembly and for retracting said electrode from the interconnector.

15. A machine for attaching interconnectors onto solar cells and the like, comprising:
a machine frame;
a turntable supported for rotation relative to said frame;
a plurality of operating stations on said frame and arranged generally about the periphery of said turntable;
a plurality of fixtures mounted on said turntable in a generally equiangular arrangement about the periphery thereof for sequential alignment with each of said operating stations, each of said fixtures including means for supporting a solar cell in sequential association with said operating stations;
means for rotating said turntable in increments to index said fixtures into alignment with the next respective operating station in sequence;
said operating stations comprising a loading station for loading a cell onto each fixture indexed thereto, a flux station for applying a flux material to each fixture-supported cell indexed thereto, an interconnector attachment station for placing an interconnector on each flux-bearing cell indexed thereto on one of said fixtures, an attachment station for attaching the interconnector to the cell of each interconnector bearing cell indexed thereto on one of said fixtures to form a cell/interconnector subassembly, and an unloading station for unloading each cell/interconnector subassembly indexed thereto on one of said fixtures; and
said unloading station comprising a first cell unloading means and a second cell unloading means, and said inspection station including viewing means for identifying reject and acceptable subassemblies and means for controlling said first and second unloading means for selective unloading of rejected subassemblies at said first unloading station and acceptable subassemblies at said second unloading means.

16. A machine for attaching interconnectors onto solar cells and the like, comprising:
a machine frame;
a turntable supported for rotation relative to said frame;
a plurality of fixtures mounted on said frame in a generally equiangular arrangement generally about the turntable periphery, each of said fixtures including an upwardly presented track for seated, precision placement of a respective solar cell;
a plurality of operating stations on said frame and arranged generally about the periphery of said turntable for alignment with respective ones of said fixtures and for operative association with solar cells supported on said fixtures, said operating stations including;
a cell loading station including a first receptacle on said frame for receiving and supporting a cell loading magazine preloaded with a plurality of solar cells, means for removing one of the cells from the loading magazine and for placing the cell onto the one of said fixtures at said loading station, means for preventing turntable rotation unless the cell is properly loaded on the one of said fixtures at said loading station, and means for shifting the loading magazine for orienting a subsequent cell therein for removal by said removing means and for placement onto a subsequent one of said fixtures indexed to said loading station,
a flux station having a flux applicator head, means for moving said applicator head to pick up a quantity of a liquid flux material and to descend into contact with a predetermined point on a cell supported on the one of said fixtures at said flux station to apply flux material to the cell and then to retract said head upwardly from the cell, and means for preventing rotation of said turntable until said applicator head is retracted upwardly by said applicator head moving means,
an interconnector dispensing station including a ribbon having a progression of interconnectors formed along the length thereof, ribbon feeding means for feeding said ribbon to align the next successive interconnector therealong in a position generally above a flux-bearing cell supported on the one of said fixtures at said dispensing station, a punch head for descending movement to separate said next successive interconnector from said ribbon and for placing same in a predetermined position on the underlying cell, said punch head returning thereafter to an elevated position, means for supplying said ribbon to said feeding means at a controlled ribbon tension, and means for preventing turntable rotation unless said punch head has returned to its elevated position,
an attachment station including means for descending into contact with an interconnector supported on a cell in turn supported on the one of said fixtures at said attachment station for attaching the interconnector to the cell to form a cell/interconnector subassembly and then for returning to an elevated position above the underlying interconnector, and means for preventing turntable rotation until said attaching means returns to its elevated position, and
an unloading station including means for descending into contact with and for returning to an elevated position for picking up a cell/interconnector subassembly supported on the one of said fixtures at said unloading station, means for transferring the picked-up subassembly into an unloading magazine received within a second receptacle on said frame for placing the same in said unloading magazine and then for retraction therefrom, means for shifting said unloading magazine for reception of a subsequent subassembly upon rotation of a subsequent subassembly to said unloading station, and means for preventing turntable indexing unless said pick-up head is in its elevated position; and
means for rotatably indexing said turntable for indexing solar cells supported thereon simultaneously and respectively to the next sequential one of said operating stations.

* * * * *